(12) United States Patent
Bringivijayaraghavan et al.

(10) Patent No.: US 11,302,415 B2
(45) Date of Patent: Apr. 12, 2022

(54) ROW ADDRESS COMPARATOR FOR A ROW REDUNDANCY CONTROL CIRCUIT IN A MEMORY

(71) Applicant: Marvell Asia Pte, Ltd., Singapore (SG)

(72) Inventors: Venkatraghavan Bringivijayaraghavan, Cheyyar (IN); Sreejith Chidambaran, Kerala (IN); Prasad Vernekar, Karwar (IN)

(73) Assignee: Marvell Asia Pte, Ltd., Singapore (SG)

( * ) Notice: Subject to any disclaimer, the term of this patent is extended or adjusted under 35 U.S.C. 154(b) by 305 days.

(21) Appl. No.: 16/711,929

(22) Filed: Dec. 12, 2019

(65) Prior Publication Data
US 2021/0183460 A1 Jun. 17, 2021

(51) Int. Cl.
| | |
|---|---|
| *G11C 29/38* | (2006.01) |
| *G11C 11/412* | (2006.01) |
| *G11C 29/00* | (2006.01) |
| *G11C 29/44* | (2006.01) |
| *G11C 11/418* | (2006.01) |

(Continued)

(52) U.S. Cl.
CPC .............. *G11C 29/76* (2013.01); *G11C 8/10* (2013.01); *G11C 8/18* (2013.01); *G11C 11/412* (2013.01); *G11C 11/418* (2013.01); *G11C 29/38* (2013.01); *G11C 29/44* (2013.01)

(58) Field of Classification Search
CPC ......... G11C 29/76; G11C 29/38; G11C 29/44; G11C 8/10; G11C 8/18; G11C 11/412; G11C 11/418
See application file for complete search history.

(56) References Cited

U.S. PATENT DOCUMENTS

| | | |
|---|---|---|
| 5,255,227 A | 10/1993 | Haeffele |
| 5,572,471 A | 11/1996 | Proebsting |
| 5,841,712 A | 11/1998 | Wendell et al. |

(Continued)

FOREIGN PATENT DOCUMENTS

CN 109983446 A * 7/2019 ......... G06F 12/1009

OTHER PUBLICATIONS

Amirkhanyan et al., "Design of Reparable Memory Systems with Shared Row Redundancies", IEEE 11th International Conference, 2017, pp. 1-4.

(Continued)

*Primary Examiner* — Sultana Begum

(57) ABSTRACT

Disclosed is a row address comparator with voltage level shifting and latching functionality and including: an evaluation section for comparing two row addresses in a first voltage domain and outputting an initial match signal in a second voltage domain; and a latch section for outputting a latched final match signal based on the initial match signal. The comparator employs a first clock signal (CLK1), a second clock signal (CLK2) that is different from CLK1 and a third clock signal (CLK3) that is inverted with respect to CLK2. CLKs 1 and 2 control pre-charge and evaluation operations within the evaluation section with CLK2 being set to minimize hold time. CLKs 2 and 3 control the latch operation within the latch section. Feedback loops in both sections enhance performance. Also disclosed are a control circuit that incorporates the comparator and a method for implementing row redundancy in a memory.

20 Claims, 10 Drawing Sheets

(51) Int. Cl.
*G11C 8/10* (2006.01)
*G11C 8/18* (2006.01)

(56) References Cited

U.S. PATENT DOCUMENTS

| | | |
|---|---|---|
| 5,872,467 A | 2/1999 | Huang |
| 6,393,504 B1 | 5/2002 | Leung et al. |
| 6,456,116 B1 | 9/2002 | Coppin |
| 6,694,448 B2 | 2/2004 | Callahan |
| 6,754,863 B1 * | 6/2004 | Grannis, III ....... G01R 31/2815 714/729 |
| 6,992,937 B2 | 1/2006 | Tran et al. |
| 7,395,443 B1 * | 7/2008 | Kromer ................ G06F 1/3287 713/324 |
| 7,738,308 B2 | 6/2010 | Afghahi et al. |
| 8,729,923 B2 | 5/2014 | Ramachandra |
| 2006/0179368 A1 | 8/2006 | Chang et al. |
| 2010/0211364 A1 * | 8/2010 | Mandal ................... G06G 7/58 703/2 |
| 2011/0025379 A1 | 2/2011 | Neto et al. |
| 2016/0078969 A1 | 3/2016 | Jung et al. |

OTHER PUBLICATIONS

Moulali et al., "Sram Cell Static Faults Detection and Repair Using Memory Bist", International Journal of Computer Science and Information Technologies, vol. 3 (1), 2012, pp. 3264-3268.

Nautiyal et al., "Logic-Based Row Redundancy Technique Designed in 7nm FinFET Technology for Embedded SRAMs", IEEE, 19th Int'l Symposium on Quality Electronic Design (ISQED), 2018, pp. 1-2, Abstract.

Sravani et al., "Built-in Self Repair for SRAM Array using Redundancy", ACEEE Int. J. on Communication, vol. 02, No. 01, 2011, pp. 18-21.

IWave Systems, "SRAM with Memory Redundancy, an Idea to Increase Throughput and Decrease the Cost", SRAM with Memory Redundancy, 2013, pp. 1-4.

* cited by examiner

ROW ADDRESS COMPARATOR FOR A ROW REDUNDANCY CONTROL CIRCUIT IN A MEMORY

BACKGROUND

Field of the Invention

The present invention relates to row redundancy schemes in memories and, more particularly, to a row address comparator for a row redundancy control circuit in a memory.

Description of Related Art

Key factors considered in modern integrated circuit design include, but are not limited to, performance, power scaling, and size scaling. However, oftentimes improvement with respect to one of these factors can result in an undesirable trade-off with respect to one or more of the other factors.

For example, in memories (e.g., static random access memories (SRAMs)), performance can be improved through the use of one or more redundant rows of memory cells (also referred to as spare or secondary rows) so that, if/when one or more memory cells in any of the primary rows in a memory array is/are determined to be defective, a redundant row can be used, thereby avoiding memory failures. To implement a redundancy scheme, defective row information can be stored in a defective row memory (e.g., a fused-based memory) and a row redundancy control circuit (also referred to herein as a row redundancy logic block) can determine whether or not to use the primary row or one of the redundant rows, based on this defective row information, and can output the appropriate signals to make that happen.

For example, initially one or more default row addresses (e.g., row address(es) having all 0 bits) can be stored in a defective row memory at one or more locations that are associated with one or more redundant rows, respectively. If a primary row within the memory array is determined to have any defective memory cells, a default row address at a specific storage location associated with a specific one of the redundant rows can be replaced with the primary row address, thereby indicating that the primary row is defective and that the specific redundant row should now be used as a substitute row for that primary row. Subsequently, during an operation to write data to or read data from a selected memory cell in any given primary row of the memory array, the primary row address for that given primary row is received by the row redundancy control circuit prior to decoding. For each specific redundant row, the row redundancy control circuit includes an address comparator that compares a received primary row address to a stored row address, which is associated with that specific redundant row in the defective row memory. If the primary row address does not match the stored row address (e.g., if the stored row address is still the default row address), then the row redundancy control circuit causes data to be written to/read from the selected memory cell in the primary row identified by the primary row address by forwarding the primary row address to the row decoder. If the primary row address does match the stored row address (thereby indicating that the primary row has defective memory cell(s)) and if redundancy is enabled, then the row redundancy control circuit can cause data to be written to/read from the corresponding memory cell in that specific redundant row and not the primary row by forwarding the row address for the specific redundant row to the row decoder. While row redundancy improves performance by preventing memory failures, row redundancy control circuit complexity increases with increasing redundancy and, thus, increases circuit size.

Additionally, in SRAMs, power scaling can be achieved by reducing the supply voltage. However, reducing the supply voltage to SRAM cells can increase susceptibility to soft errors (i.e., memory failures). Thus, dual-rail SRAMs have been developed and these dual-rail SRAM arrays incorporate two voltage rails to allow different memory functions to operate in different voltage domains. Specifically, in such dual-rail SRAMs, a first voltage rail is at a first voltage level and a second voltage rail is at a second voltage level that is greater than the first voltage level. The second or higher voltage level (referred to herein as a cell supply voltage (VCS)) can be used for memory cell operations, including wordline activation, and the first or lower voltage level (referred to herein as a logic supply voltage (VDD)) can be used for other memory array operations, including bitline pre-charging operations. Using the second or higher voltage level (VCS) for wordline activation avoids soft error memory failures and using the first or lower voltage level (VDD) for other operations allows for reduced power consumption when having a high voltage level is not critical.

However, if a memory employs both row redundancy and dual voltage domains, the upstream circuitry that provides the row addresses for wordline activation (including the received primary row address for a given primary row and the stored row address(es) associated with the redundant rows) to the row redundancy control circuit will operate in a first voltage domain (e.g., at a first voltage level, at VDD) and the downstream circuitry (e.g., the row decoder, etc.) will operate in a second voltage domain (e.g., at a second voltage level, at VCS). Thus, the row redundancy control circuit must include multiple voltage level shifters (also referred to herein as voltage level translators) including, but not limited to, voltage level shifters that convert the primary row address and the redundancy row addresses, any redundancy enable signals, and a clock signal from the first voltage domain to the second voltage domain prior to performing any address comparison operations. The additional circuitry increases the number of gates and the logic depth in the data path and increases the setup time for the address pins.

SUMMARY

In view of the foregoing, disclosed herein are embodiments of a row address comparator with integrated voltage level shifting (also referred to herein as voltage level translating) and latching functionality. The row address comparator can include an evaluation section and a latch section. The evaluation section can be adapted to perform an evaluation operation. The evaluation operation can include comparing a first row address to a second row address, both of which are in a first voltage domain. The evaluation operation can further include, based on results of the comparing, outputting an initial match signal in a second voltage domain that is different from the first voltage domain (i.e., outputting a voltage level-translated initial match signal). The evaluation operation can specifically be controlled using a first clock signal and a second clock signal. Both clock signals can be in the second voltage domain and the second clock signal can be different from the first clock signal (e.g., the second clock signal can have a longer pulse width). The latch section can be connected to the evaluation section and can be adapted to perform a latch operation. The latch operation can include generating a final match signal based on the initial match signal and further latching that final match signal. The latch operation can specifically be controlled using the second clock signal and a third clock signal. The third clock signal (like the first and second clock signals) can be in the second voltage domain and can specifically be inverted with respect to the second clock signal.

Also disclosed herein are embodiments of a row redundancy control circuit for a memory that incorporates multiple instances of one of the row address comparators described above. Specifically, the row redundancy control circuit can include multiple row address comparators associated with different redundant rows, respectively, of multiple redundant rows for a memory array. Each row address comparator can be associated with a specific one of the redundant rows and, as discussed above, can include an evaluation section and a latch section.

Specifically, the evaluation section of each row address comparator can be adapted to perform an evaluation operation. The evaluation operation can include comparing a first row address (which is the same for each comparator) to a second row address (which is different for each comparator).

For example, the first row address can be an inverted version of a primary row address for a primary row in the memory. Alternatively, the first row address could be the actual primary row address for a primary row in the memory. As discussed further in the detailed description section, the type of logic gates incorporated into the evaluation section for performing the comparing operation will vary depending upon whether the primary row address is inverted or not inverted. In any case, the second row address can be a stored row address received from a defective row memory and, particularly, from a location in the defective row memory associated with a specific redundant row. Both the first row address and the second row address can be in a first voltage domain.

The evaluation operation can further include, based on the results of the comparing, outputting an initial match signal in a second voltage domain that is different from the first voltage domain (i.e., outputting a voltage level-translated initial match signal). The evaluation operation can specifically be controlled using a first clock signal and a second clock signal. Both clock signals can be in the second voltage domain and the second clock signal can be different from the first clock signal (e.g., the second clock signal can have a longer pulse width). The latch section of each row address comparator can be connected to the evaluation section and can be adapted to perform a latch operation. The latch operation can include generating a final match signal based on the initial match signal and latching that final match signal. The latch operation can specifically be controlled using the second clock signal and a third clock signal. The third clock signal (like the first and second clock signals) can be in the second voltage domain and can specifically be inverted with respect to the second clock signal.

The row redundancy control circuit can further include a match controller and a multiplexor. The match controller can be adapted to receive multiple final match signals from the multiple row address comparators, respectively. Each final match signal will be associated with a specific redundant row and will indicate whether the primary row address matches a stored row address associated with that specific redundant row such that the specific redundant row should substitute for the primary row. Based on these final match signals, the match controller can output a row selection control signal to the multiplexor. The multiplexor can be adapted to receive the row selection control signal and, based on the row selection control signal, select one row in the memory from amongst the primary row and the multiple redundant rows.

Since the row address comparators voltage level-translate the match signals without requiring voltage-level shifters for each bit of each of the two row addresses being compared, the disclosed row redundancy control circuit consumes less chip area than prior art circuits used to implement row redundancy schemes. Additionally, since the row address comparators also provide for match signal latching, downstream latching within the row redundancy control circuit is unnecessary and delay is reduced.

Also disclosed herein are embodiments of a method for implementing a row redundancy scheme that includes integrating row address comparison, voltage level shifting and latching operations. The method can include performing an evaluation operation. The evaluation operation can be performed by an evaluation section of a row address comparator and can include comparing a first row address to a second row address, both of which are in a first voltage domain. The evaluation operation can further include, based on results of the comparing, outputting an initial match signal in a second voltage domain that is different from the first voltage domain (i.e., outputting a voltage level-translated initial match signal). The evaluation operation can specifically be controlled using a first clock signal and a second clock signal. Both clock signals can be in the second voltage domain and the second clock signal can be different from the first clock signal (e.g., the second clock signal can have a longer pulse width). The method can further include performing a latch operation. The latch operation can be performed by a latch section of a row address comparator and can include generating a final match signal based on the initial match signal and further latching that final match signal. The latch operation can specifically be controlled using the second clock signal and a third clock signal. The third clock signal (like the first and second clock signals) can be in the second voltage domain and can specifically be inverted with respect to the second clock signal.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
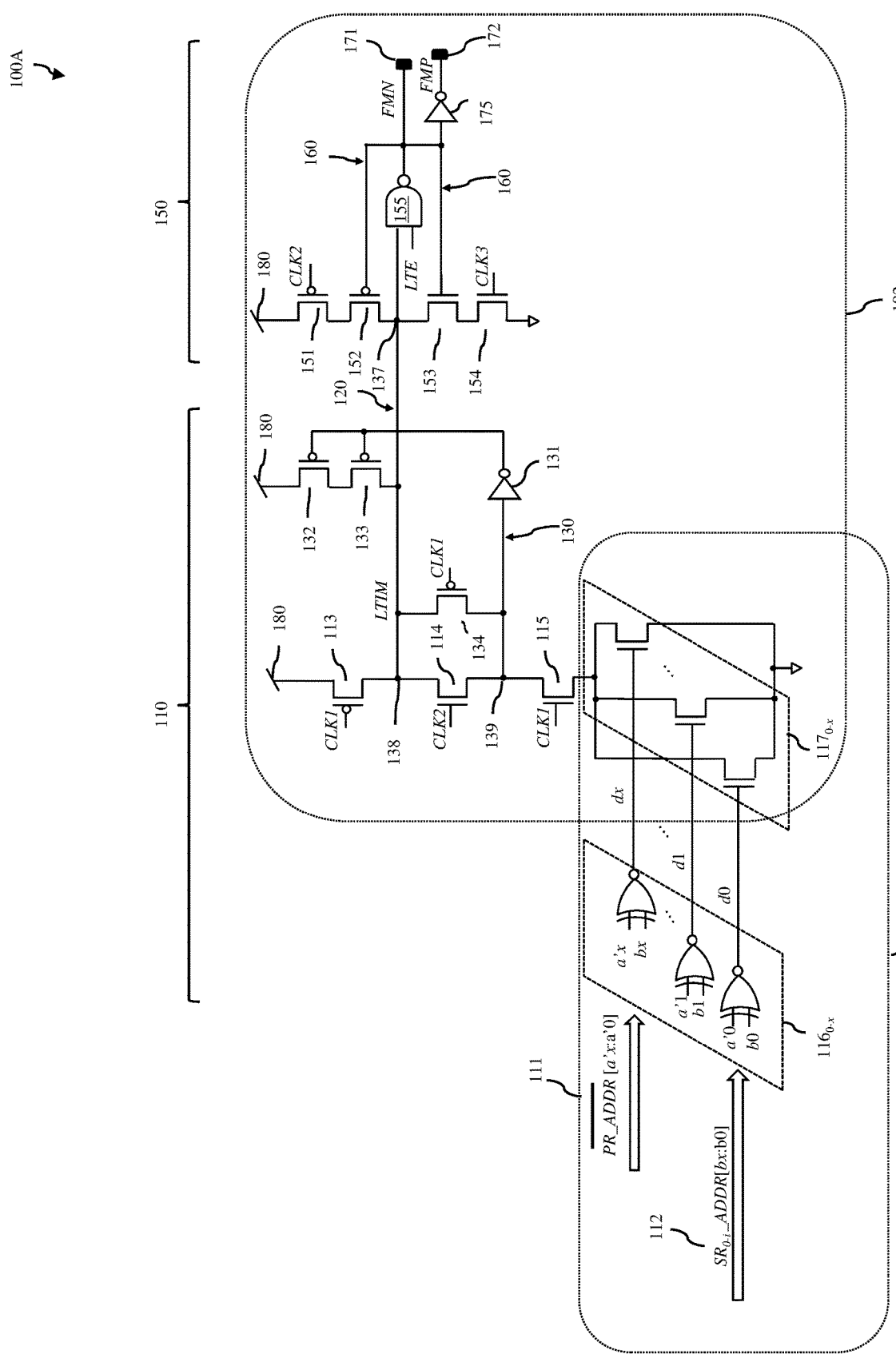
FIGS. 1A and 1B are schematic diagrams of different embodiments of a row address comparator for a row redundancy control circuit.

As mentioned above, key factors considered in modern integrated circuit design include, but are not limited to, performance, power scaling, and size scaling. However, oftentimes improvement with respect to one factor can result in an undesirable trade-off with respect to one or more of the other factors. For example, if a memory employs both row redundancy and dual voltage domains (as discussed above), the upstream circuitry that provides the row addresses for wordline activation (including the received primary row address for a given primary row and the stored row address(es) associated with the redundant row(s)) to the row redundancy control circuit will operate in a first voltage domain (e.g., at a first voltage level, such as at VDD) and the downstream circuitry (e.g., the row decoder, etc.) will operate in a second voltage domain (e.g., at a second voltage level that is greater than the first voltage level, such as at VCS). Thus, the row redundancy control circuit must include multiple voltage level shifters (also referred to herein as voltage level translators) including, but not limited to, voltage level shifters that convert the primary row address and the redundancy row addresses, any redundancy enable signals, and a clock signal from the first voltage domain to the second voltage domain prior to performing any address comparison operations. The additional circuitry increases the number of gates and the logic depth in the data path and increases the setup time for the address pins.

More specifically, consider the case where the row redundancy control circuit is configured for handling two redundant rows and where all the row addresses are eight-bit addresses (i.e., [7:0]). The row redundancy control circuit will receive the following signals in VDD: (a) three row addresses including a selected row address (e.g., either an input row address or a test row address selected by a built-in self-test (BIST) multiplexor (MUX)) and two stored row addresses associated with two different redundant rows (i.e., 3 times [7:0]); (b) two row redundancy enable signals associated with the two redundant rows, respectively; and (c) a single clock signal for signal control. Therefore, a total of twenty-seven voltage level shifters would be required to shift the received signals from VDD to VCS including twenty-four for the received row addresses (i.e., for each of the three row addresses, eight voltage level shifters for converting each bit of the eight-bit row address), plus two for the two row redundancy enable signals, plus one for the clock signal. In other words, increases in the length of the row addresses and/or increases in the number of redundant rows will significantly increase the number of voltage level shifters required for row redundancy control circuit operation and, thereby will significantly increase the overall size of the row redundancy control circuit and the setup time for the address pins.

In view of the foregoing, disclosed herein are embodiments of an improved row address comparator with integrated voltage level shifting (also referred to herein as voltage level translating) and latching functionality. Specifically, the row address comparator includes: an evaluation section, which performs pre-charge and evaluation operations in order to compare two row addresses in a first voltage domain and to output an initial match signal in a second voltage domain (i.e., a voltage-level translated initial match signal); and a latch section, which outputs a final match signal based on the initial match signal, and which performs a latch operation with respect to the final match signal. The row address comparator employs three different clock signals: a first clock signal, a second clock signal that is different from the first clock signal (e.g., that has a longer pulse width) and a third clock signal that is inverted with respect to the second clock signal. The first and second clock signals control pre-charge and evaluation operations within the evaluation section with the second clock signal specifically being employed to minimize the row address hold time and the second and third clock signals control the latch operation within the latch section. Also disclosed herein are embodiments of a row redundancy control circuit that incorporates one or more instances of the above-described row address comparator as well as embodiments of a method for integrating row address comparing, voltage level shifting and latching operations in a row redundancy scheme.

Figure 1B:
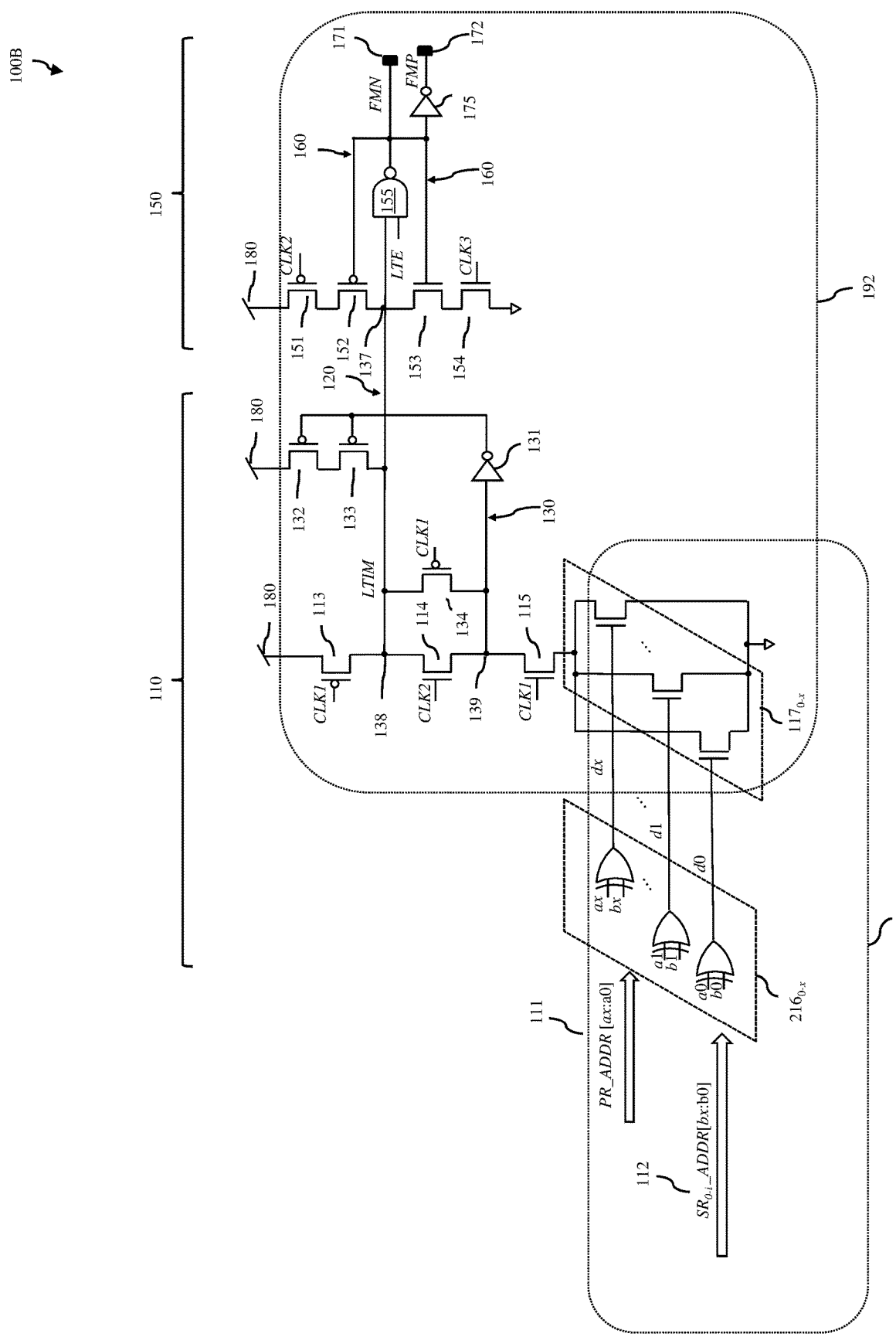

FIGS. 1A and 1B are schematic diagram illustrating embodiments of a row address comparator 100A and 100B, respectively, with integrated voltage level shifting (also referred to herein as voltage level translating) and latching functionality.

The operations of the row address comparator 100A, 100B can be performed in a combination of voltage domains including a first voltage domain 191 and a second voltage domain 192 that is different from the first voltage domain 191. The first voltage domain 191 can include a range of voltage levels from ground (GND, also referred to as USS) to a first maximum positive supply voltage (also referred to as VDD). The second voltage domain 192 can include a range of voltage levels from ground (GND or VSS) to a second maximum positive supply voltage, referred to herein as the cell supply voltage (VCS), which is greater than the first maximum positive supply voltage (VDD).

Figure 2:
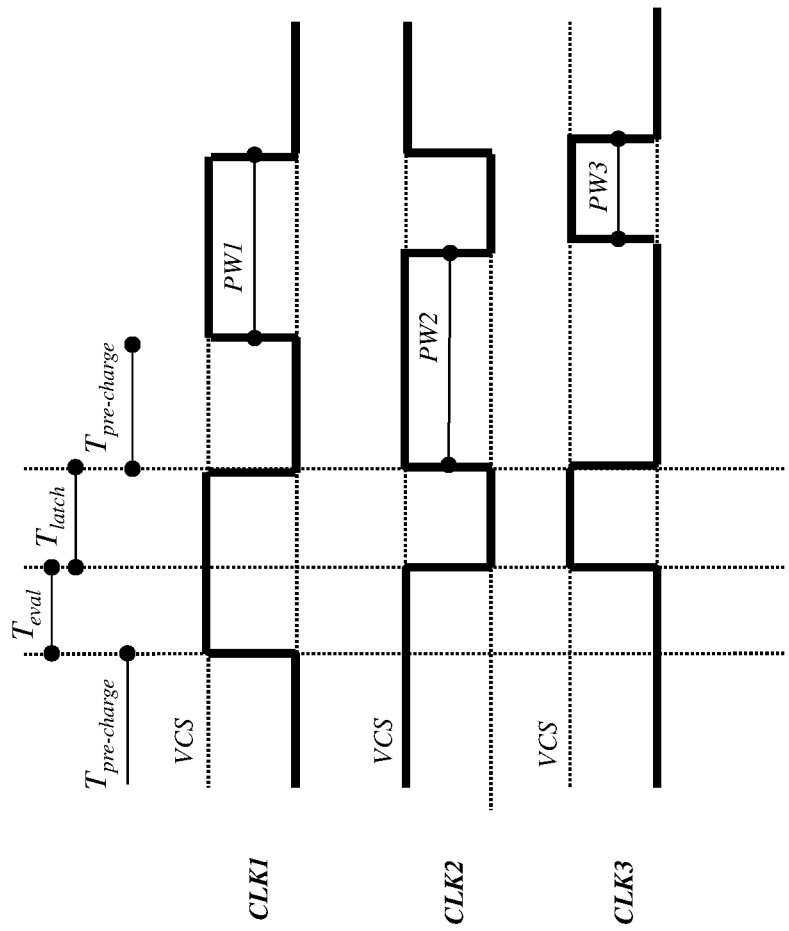
FIG. 2 is a timing diagram illustrating the clock signals used to control the various operations performed by the row address comparator.

Additionally, the operations of the row address comparator 100A, 100B can be controlled using a combination of three different clock signals including a first clock signal (CLK1), a second clock signal (CLK2) that is different from CLK1 (as discussed in greater detail below), and a third clock signal (CLK3) that is inverted with respect to CLK2. As illustrated in the timing diagram of FIG. 2, CLK1 can have first rising and falling edges and a first pulse width (PW1), CLK2 can have second rising and falling edges and a second pulse width (PW2), and CLK3 can have third rising and falling edges and a third pulse width (PW3). PW2 of CLK2 can be longer than PW1 of CLK1, which can in turn be longer than PW3 of CLK3. Furthermore, the first rising edge of CLK1 can occur when CLK2 is at a high voltage state and CLK3 is at a low voltage state so that the second falling edge of CLK2 (and the concurrent first rising edge of CLK3) occurs between the first rising and falling edges of CLK1, and so that the second rising edge of the CLK2 (and the concurrent third falling edge of CLK3) approximately coincides with a first falling edge of CLK1. The three clock signals (CLK1, CLK2 and CLK3) will all be generated and received by the row address comparator in the second voltage domain 192. Thus, when in a high voltage state, the voltage level of these clock signals will be at or near VCS and, when in a low voltage state, the voltage level of these clock signals will be at or near VSS. As discussed in greater detail below, the delay between the first rising edge of CLK1 and the second falling edge of CLK2 will define the evaluation time period (Teval) for comparing two row addresses.

In any case, each of embodiments of the row address comparator 100A and 100B can include an evaluation section 110 and a latch section 150 connected to the evaluation section 110.

The evaluation section 110 can be adapted to perform pre-charge and evaluation operations and the evaluation operation can include integrated voltage level shifting. Specifically, the evaluation section 110 can be adapted to receive and compare two row addresses (i.e., a first row address 111 and a second row address 112). As discussed in greater detail below, the evaluation section of the row address comparator 100A differs from the evaluation section of the row address comparator 100B with respect to the type of first row address received received (i.e., an inverted primary row address or a primary row address) and the type of logic gates employed to perform the row address comparison (i.e., XNOR gates or XOR gates, respectively).

More specifically, a row redundancy control circuit will typically receive a first row address 111 to be processed from a built-in self-test (BIST) multiplexor, which selects between an input row address and a test row address. In some circuits, the received first row address 111 from the BIST multiplexor is an inverted version of a primary row address (i.e., an inverted primary row address) for a primary row in a memory array. For example, see the inverted primary row address (PR_ADDRbar [a'x:a'0]) shown in the row address comparator 100A of FIG. 1A. Those skilled in the art will recognize that in an inverted primary row address, the value of each bit in the primary row address has been switched (i.e., logic 1's are switched to logic 0's and vice versa) by a set of inverters. In other circuits, the received first row address 111 is the actual primary row address for the primary row in the memory array. For example, see the primary row address (PR_ADDR [ax:a0]) shown in the row address comparator 100B of FIG. 1B.

The row address comparator 100A is configured to process the inverted primary row address (PR_ADDRbar [a'x:a'0]) directly without having to invert it, thereby avoiding inversion gate delay. The row address comparator 100B is configured to process the actual primary row address (PR_ADD[ax:a0]) (e.g., if either the actual primary row address is received by the row redundancy control circuit from the multiplexor or the inverted primary row address is received by the row redundancy control circuit and then processed by a set of inverters that regenerates the primary row address before processing by the row address comparator).

In either case, the second row address 112 received by the row address comparator 100A, 100B can be a stored row address (SR_ADDR [bx:b0]), which has been acquired from a defective row memory at a location that is associated with a specific redundant row. Each of these two row addresses (which are defined as R_ADDR [x:0]) will have the same number of bits (i.e., (x+1) bits). For example, row addresses defined as R_ADDR [7:0] will have 8 bits, row addresses defined as ADDR [6:0] will have 7 bits, and so on. Additionally, it should be noted that both first row address 111 and the second row address 112 will be in the first voltage domain (e.g., in VDD). That is, within the row addresses, each bit with a low logic state will be at or near VSS and each bit with a high logic state will be at or near VDD.

As discussed above, the primary function of a row address comparator in a row redundancy control circuit is to determine whether a received primary row address either matches or doesn't match a stored row address associated with a specific redundant row in the defective row memory. If the row address comparator determines that the primary row address does not match the stored row address (e.g., if the stored row address is still the default row address), then the row redundancy control circuit can cause data to be written to/read from the selected memory cell in the primary row identified by the primary row address. However, if the row address comparator determines that the primary row address does match the stored row address (e.g., thereby indicating that the primary row has defective memory cell(s)), then the row redundancy control circuit can (if redundancy is enabled) cause data to be written to/read from the corresponding memory cell in that specific redundant row (i.e., can substitute the specific redundant row for the primary row).

To accomplish this comparison without first having to perform voltage level shifting on the two row addresses, the evaluation section 110 of the row address comparator 100A, 100B can also be adapted to receive the first clock signal (CLK1) and the second clock signal (CLK2), which as mentioned above are both in the second voltage domain. The evaluation section 110 can further be adapted to perform an evaluation operation that is controlled by CLK1 and CLK2 in combination and that includes comparing the first row address 111 to the second row address 112 and, based on results of the comparing, outputting an initial match signal in the second voltage domain. In other words, the initial match signal is voltage level-translated from VDD to VCS or, more particularly, is a level-translated initial match signal (LTIM).

For example, consider the embodiment of the row address comparator 100A, shown in FIG. 1A. The voltage level of the initial match signal (LTIM) will indicate whether or not the first row address 111 (i.e., the inverted primary row address) and the second row address 112 (i.e., the stored row address) are entirely mismatched. If the first row address 111 (i.e., the inverted primary row address) and the second row address 112 (i.e., the stored row address) are entirely mismatched, then it should be understood that the primary row address and the stored row address match. To accomplish this, the evaluation section 110 can include a set of x+1 XNOR gates $116_{0-x}$, one for each bit of the x+1 bits in each of the two row addresses. Each XNOR gate $116_{0-x}$ can be adapted to receive one first bit from a specific bit position 0 to x in the first row address and a corresponding second bit from the same bit position in the second row address and to output a bit match signal according to a conventional XNOR gate truth table (see bit match signals ($d_{0-x}$), all of which are also in the first voltage domain). That is, if two bits from the same position in the two row addresses 111 and 112 match (i.e., if they are either both logic 1's or both logic 0's), then the bit match signal d for that bit position will be a 1 (i.e., will have a high voltage state at or near VDD). If two bits from the same position in the two row addresses 111 and 112 do not match (i.e., are either a 1 and a 0 or a 0 and a 1), then the bit match signal d for that bit position will be a logic 0 (i.e., will have a low voltage state at or near VSS).

Thus, it should be understood that all of the bit match signals ($d_{0-x}$) from all of the XNOR gates $116_{0-x}$ will be logic 0's if/when none of the bits of the first row address 111 (which as mentioned above is an inverted primary row address (PR_ADDRbar [ax:a0])) match the corresponding bits at the same bit positions in the second row address 112 (which as mentioned above is a stored row address (SR_ADDR [bx:b0]) from a defective row memory). That is, the bit match signals ($d_{0-x}$) from all of the XNOR gates $116_{0-x}$ will be logic 0's when the first row address 111 (i.e., the inverted primary row address (PR_ADDRbar [ax:a0])) and the second row address 112 (i.e., the stored row address (SR_ADDR [bx:b0])) are entirely mismatched. Consequently, when the bit match signals ($d_{0-x}$) from the comparison of the first row address and the second row address are all logic 0's (indicating no matched bits), it should be understood that all bits of the primary row address (PR_ADDR [ax:a0]) will in fact match all the corresponding bits of the stored row address (SR_ADDR [bx:b0]) (i.e., the primary row address is identical to the stored row address).

The evaluation section 110 can further include a positive voltage rail 180 in the second voltage domain (i.e., at the second maximum positive supply voltage (i.e., at VCS) and a ground rail (i.e., a VSS rail). The evaluation section 110 can further include a pull-up transistor 113 (i.e., a p-type field effect transistor (PFET)), a first pull-down transistor 114 (i.e., a first n-type field effect transistor (NFET)), a second pull-down transistor 115 (i.e., a second NFET) and a set of x+1 parallel-connected pull-down transistors $117_{0-x}$ (i.e., parallel-connected NFETs) connected in series between the positive voltage rail 180 and the ground rail. That is, the source region and the drain region of the pull-up transistor 113 are connected to the positive voltage rail 180 and the drain region of the first pull-down transistor 114, respectively. The drain region and the source region of the first pull-down transistor 114 are connected to the drain region of the pull-up transistor 113 and the drain region of the second pull-down transistor 115, respectively. The drain region and the source region of the second pull-down transistor 115 are connected to the source region of the first pull-down transistor 114 and the drain regions of all the pull-down transistors in the set of parallel-connected pull-down transistors $117_{0-x}$, respectively. The drain regions and the source regions of all of the pull-down transistors in the set of parallel-connected pull-down transistors $117_{0-x}$ are connected to the source region of the second pull-down transistor 115 and the ground rail, respectively.

The evaluation section 110 can further include a feed-forward path 120 (i.e., a wire or other interconnect) that electrically connects a node 138, which is at the junction between the drain regions of the pull-up transistor 113 and the first pull-down transistor 114, to the latch section 150. The feed-forward path 120 is adapted to output the initial match signal (LTIM) to the latch section 150.

The evaluation section 110 can further include a first feedback loop 130. The first feedback loop 130 can include: a pair of series-connected pull-up transistors 132 and 133 (i.e., series-connected PFETs) connected between the positive voltage rail 180 and the feed-forward path 120; an inverter 131 having an input connected to a node 139 at the junction between the source region of the first pull-down transistor 114 and the drain region of the second pull-down transistor 115 and an output connected to the gates of the series-connected pull-up transistors 132-133; and an additional pull-up transistor 134 (i.e., an additional PFET) having a source region connected to the feed-forward path 120, and a drain region connected to the first feedback loop 130 downstream of the inverter 131.

In the evaluation section 110, the gates of the pull-up transistor 113, the second pull-down transistor 115, and the additional pull-up transistor 134 are adapted to receive CLK1 such that the on/off states of the pull-up transistor 113, the second pull-down transistor 115, and the additional pull-up transistor 134 are all controlled by CLK1, which as mentioned above is in the second voltage domain. The gate of the first pull-down transistor 114 is adapted to receive CLK2 such that the on/off state of the first pull-down transistor 114 is controlled by CLK2. As mentioned above, the gates of the series-connected pull-up transistors 132-133 are adapted to receive the output of the inverter 131 such that the on/off state of these pull-up transistors 132-133 are controlled by the output of the inverter 131 and, thereby the voltage level on the first feedback path adjacent to the input of the inverter (e.g., the voltage level at the node 139 between the two pull-down transistors 114 and 115). Finally, the gates of the parallel-connected pull-down transistors $117_{0-x}$ can be adapted to receive the bit match signals ($d_{0-x}$) from the XNOR gates $116_{0-x}$, respectively. Thus, the on/off states of the parallel-connected pull-down transistors $117_{0-x}$ are controlled by the bit match signals ($d_{0-x}$), respectively (which as mentioned above are in the first voltage domain).

In order to perform an evaluation operation, a pre-charge operation must first be performed in the evaluation section. The pre-charge operation is triggered when CLK1 switches to the low voltage state such that the pull-up transistor 113 turns on, thereby pulling up the voltage level on the feed-forward path 120 and, particularly, pre-charging the feed-forward path 120 to the high voltage state (i.e., at or near VCS). It should be noted that the first feedback loop 130 enhances this pre-charge operation. Specifically, the additional pull-up transistor 134 in the first feedback loop 130 is also turned on when CLK1 switches to the low voltage state, thereby pulling up the voltage level at the input to the inverter 131 such that the output of the inverter 131 has a low voltage state. As a result, the series-connected pull-up transistors 132-133 are also turned on ensuring that the voltage level on the feed-forward path 120 is pulled up. It should also be noted that even though CLK2 has a high voltage state at this point in time such that the first pull-down transistor 114 is turned on, the second pull-down transistor 115 will be turned off due to CLK1 being low, thereby preventing pull-down of the voltage level on the feed-forward path 120. Consequently, the pre-charge operation in combination with the first feedback loop ensures that at the beginning of the evaluation operation the initial match signal (LTIM) will have a high voltage state.

The evaluation operation occurs in the evaluation section 110 immediately following the above-described pre-charge operation and prior to the latch operation that occurs in the latch section 150. The evaluation operation is triggered when CLK1 switches from the low voltage state to the high voltage state (while CLK2 remains in the high voltage state). The initial match signal (LTIM) on the feed-forward path 120 will either remain the same (i.e., at the high voltage state) or drop depending upon the states of the bit match signals ($d_{0-x}$) that are output from the XNOR gates $116_{0-x}$ and applied to the gates of the parallel-connected pull-down transistors $117_{0-x}$, respectively. Specifically, when CLK1 switches to the high voltage state, the pull-up transistor 113 and the additional pull-up transistor 134 both turn off, thereby preventing the voltage level on the feed-forward path 120 and the voltage level on the first feedback path 130 at the input to the inverter 131 from being pulled up. Additionally, the second pull-down transistor 115 turns on (along with the first pull-down transistor 114, which is already on due to CLK2 remaining in the high voltage state).

During the evaluation operation, if all of the bit match signals ($d_{0-x}$) output from all of the XNOR gates $116_{0-x}$, respectively, are logic 0's, then all of the parallel-connected pull-down transistors $117_{0-x}$ will remain turned off, thereby preventing the voltage level on the up path 120 from being pulled down through the first pull-down transistor 114, second pull-down transistor 115 and any of the parallel-connected pull-down transistors $117_{0-x}$. It should be noted that the first feedback loop 130 is adapted to prevent unwanted switching of the initial match signal (LTIM) from the high voltage state to the low voltage state due to parasitic capacitance at the nodes 138 and 139 if/when all of the bit match signals ($d_{0-x}$) output from all of the XNOR gates $116_{0-x}$, respectively, are logic 0's. Specifically, as long as the voltage level on the first feedback loop 130 at the input to the inverter 131 remains high, the output of the inverter 131 will be low and the series-connected pull-up transistors 132-133 will be on, thereby keeping the voltage level of the initial match signal (LTIM) high. As mentioned above, if/when all of the bit match signals ($d_{0-x}$) output from all of the XNOR gates $116_{0-x}$, respectively, are logic 0's, the first row address 111 and second row address 112 are entirely mismatched and, thus, the primary row address and the stored row address match (i.e., are identical).

During the evaluation operation, if/when one or more of the bit match signals ($d_{0-x}$) output from any one or more of the XNOR gates $116_{0-x}$ is/are logic 1's, then the corresponding parallel-connected pull-down transistor(s) $112_{0-x}$ will turn on, thereby allowing the voltage level on the feed-forward path 120 to be pulled-down through the first pull-down transistor 114, second pull-down transistor 115 and the parallel-connected pull-down transistor(s) $112_{0-x}$ in the on-state so that the initial match signal (LTIM) switches from the high voltage state to the low voltage state. It should be noted that pulling down of the voltage level on the node 139 ensures that the output of the inverter 131 in the first feedback loop is high and that the series-connected pull-up transistors in the first feedback loop 130 are turned off, thereby preventing the initial match signal (LTIM) on the feed-forward path 120 from being pulled back up and ensuring that the initial match signal (LTIM) completes the switch from the high voltage state to the low voltage state when any of the XNOR gates $116_{0-x}$, output a logic 1. As mentioned above, if/when any of the bit match signals ($d_{0-x}$) output from any of the XNOR gates $116_{0-x}$, respectively, is/are logic 1's, the first row address 111 and second row address 112 at least partially match and, thus, the primary row address and the stored row address do not match (i.e., are not identical).

Consider also the embodiment of the row address comparator 100B, shown in FIG. 1B. This embodiment of the row address comparator can be configured the same as the embodiment of the row address comparator 100A above, except that the logic gates employed for the comparison operation are different since the first row address 111 is an actual primary row address and not an inverted primary row address. Specifically, since first row address received by the row address comparator 100B is an actual primary row address (PR_ADDR [ax:a0]) as opposed to an inverted primary row address, a set of XOR logic gates $216_{0-x}$ is incorporated into the row address comparator 100B instead of a set of XNOR gates.

The set of XOR logic gates $216_{0-x}$ will include one XOR gate for each bit of the x+1 bits in each of the two row addresses. Each XOR gate $216_{0-x}$ can be adapted to receive one first bit from a specific bit position 0 to x in the first row address and a corresponding second bit from the same bit position in the second row address and to output a bit match signal according to a conventional XOR gate truth table (see bit match signals ($d_{0-x}$), all of which are also in the first voltage domain). Thus, if two bits from the same position in the two row addresses 111 and 112 match (i.e., if they are either both logic 1's or both logic 0's), then the bit match signal d for that bit position will be a 0 (i.e., will have a low voltage state at or near VSS). If two bits from the same position in the two row addresses 111 and 112 do not match (i.e., are either a 1 and a 0 or a 0 and a 1), then the bit match signal d for that bit position will be a logic 1 (i.e., will have a high voltage state at or near VDD). Consequently, when the bit match signals ($d_{0-x}$) from the comparison of the first row address and the second row address are all logic 0's (in this case indicating all matched bits), the primary row address (PR_ADDR [ax:a0]) matches (i.e., is identical to) the stored row address (SR_ADDR [bx:b0]). As with the embodiment of the row address comparator 100A of FIG. 1A, in the row address comparator 100B of FIG. 1B, if all of the bit match signals are logic 0's, then the initial match signal (LTIM) will remain at the high voltage state; whereas, if any of the bit match signals are a logic 1, the initial match signal (LTIM) will be pulled down to the low voltage state.

As mentioned above, each of the embodiments of the row address comparator 100A and 100B can also include a latch section 150 connected to the evaluation section 110. This latch section 150 can be adapted to perform a latch operation.

Specifically, the latch section 150 can include a NAND gate 155 adapted to receive, as inputs, the initial match signal (LTIM) from the feed-forward path 120 of the evaluation section 110 and an enable signal (LTE). The enable signal (LTE) is in the second voltage domain and indicates whether or not the specific redundant row at issue is currently authorized to be used a substitute for the primary row. If so, then the enable signal will be a logic 1. If not, the enable signal will be a logic 0. The NAND gate 155 can further be adapted to output a first final match signal (FMN), according to according to a conventional NAND gate truth table, at a first output node 171. That is, the first final match signal (FMN) will be a logic 0 if/when the initial match signal (LTIM) is a logic 1 (which, as discussed above, occurs when the first row address and the second row address are completely mismatched indicating that the primary row address and the stored row address are identical) and the enable signal (LTE) is also a logic 1 (which, as discussed above, indicates that the specific redundant row at issue is currently authorized to be used as a substitute for the primary row). Otherwise, the first final match signal (FMN) will be a logic 0 (indicating that either the primary row address and the stored row address do not match or that the specific redundant row at issue is currently not authorized to be used as a substitute for the primary row).

The latch section 150 can further include an inverter 175 connected to the first output node 171 and adapted to invert the first final match signal (FMN) and to output, at a second output node 172, a second final match signal (FMP) that is inverted with respect to the first final match signal (FMN). Thus, the second final match signal (FMP) will be a logic 1 if/when the initial match signal (LTIM) is a logic 1 (which, as discussed above, in each of the embodiments occurs when the primary row address and the stored row address are identical) and the enable signal (LTE) is also a logic 1 (which, as discussed above, indicates that the specific redundant row at issue is currently authorized to be used as a substitute for the primary row). Otherwise, the second final match signal (FMN) will be a logic 1 (indicating that either the primary row address and the stored row address do not match or that the specific redundant row at issue is currently not authorized to be used as a substitute for the primary row).

The latch section 150 can further include two series-connected pull-up transistors 151-152 (i.e., two series-connected PFETs), which are connected between the positive voltage rail 180 and the feed-forward path 120 at a node 137 adjacent to the input to the NAND gate 155), and two series-connected pull-down transistors 153-154 (i.e., two series-connected NFETs), which are connected between the ground rail and the feed-forward path 120 at the node adjacent to the input to the NAND gate 155. The gate of the pull-up transistor 151 can be adapted to receive CLK2 and the gate of the pull-down transistor 154 can be adapted to receive CLK3 such that the on/off states of these transistors 151 and 154 are controlled by CLK2 and CLK3, respectively. Furthermore, since the transistors 151 and 154 are a PFET and an NFET, respectively, and since CLK3 is inverted with respect to CLK2, the transistors 151 and 154 will either both be on or both be off at any given time. Additionally, in a second feedback loop 160, the gates of the pull-up transistor 152 and the pull-down transistor 153 are adapted to receive the first final match signal (FMN) such that the on/off states of these transistors will be controlled by the first final match signal (FMN) and only one of these transistors 152 and 153 will be on at any given time.

During a latch operation, which is triggered when CLK2 switches to the low voltage state and CLK3 concurrently switches to the high voltage state, both the pull-up transistor 151 and the pull-down transistor 154 will turn on to allow either pull up or pull down of the voltage level on the feed-forward path 120 at the node 137 depending upon the on/off state of the transistors 152 and 153. If, at this time, the first final match signal (FMN) is a logic 0 (which, as discussed above, occurs only when both the initial match signal (LTIM) and the enable signal (LTE) are both logic 1's meaning that the primary row address and the stored row address match and the specific redundant row at issue is currently authorized to be used as a substitute for the primary row), then the pull-down transistor 153 will be turned off and the pull-up transistor 152 will be turned on to maintain a high voltage state on the feed-forward path 120 at the node 137 adjacent to the input to the NAND gate 155 and, thereby maintain the first final match signal (FMN) at logic 0 (and the second final match signal (FMP) at logic 1). Contrarily, at this time, the first final match signal (FMN) is a logic 1 (which, as discussed above, occurs when the initial match signal (LTIM) and/or the enable signal (LTE) is/are a logic 0 meaning that the primary row address and the stored row address do not match and/or the specific redundant row at issue is not currently authorized to be used as a substitute for the primary row), then the pull-down transistor 153 will be turned on and the pull-up transistor 152 will be turned off to keep or pull the voltage level of the feed-forward path 120 at the node 137 adjacent to the input to the NAND gate 155 low and, thereby maintain the first final match signal (FMN) at logic 1 (and the second final match signal (FMP) at logic 0).

Figure 3:
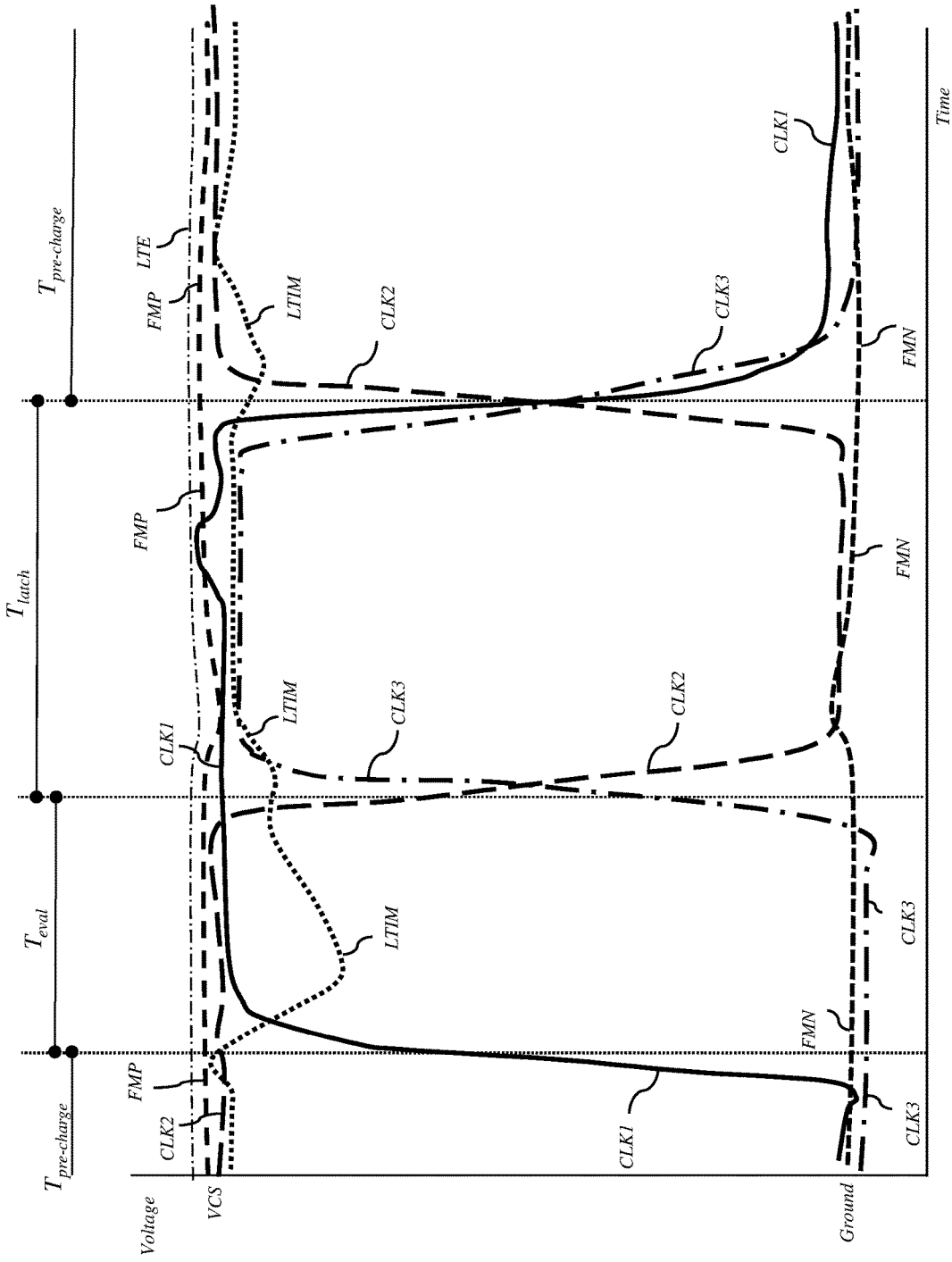
FIGS. 3-5 are timing diagrams illustrating the different states of an initial match signal output by the evaluation section of the row address comparator and two final match signals output by the latch section of the row address comparator depending upon whether or not a primary row address and a stored row address match and upon the state of an enable signal.
Figure 4:
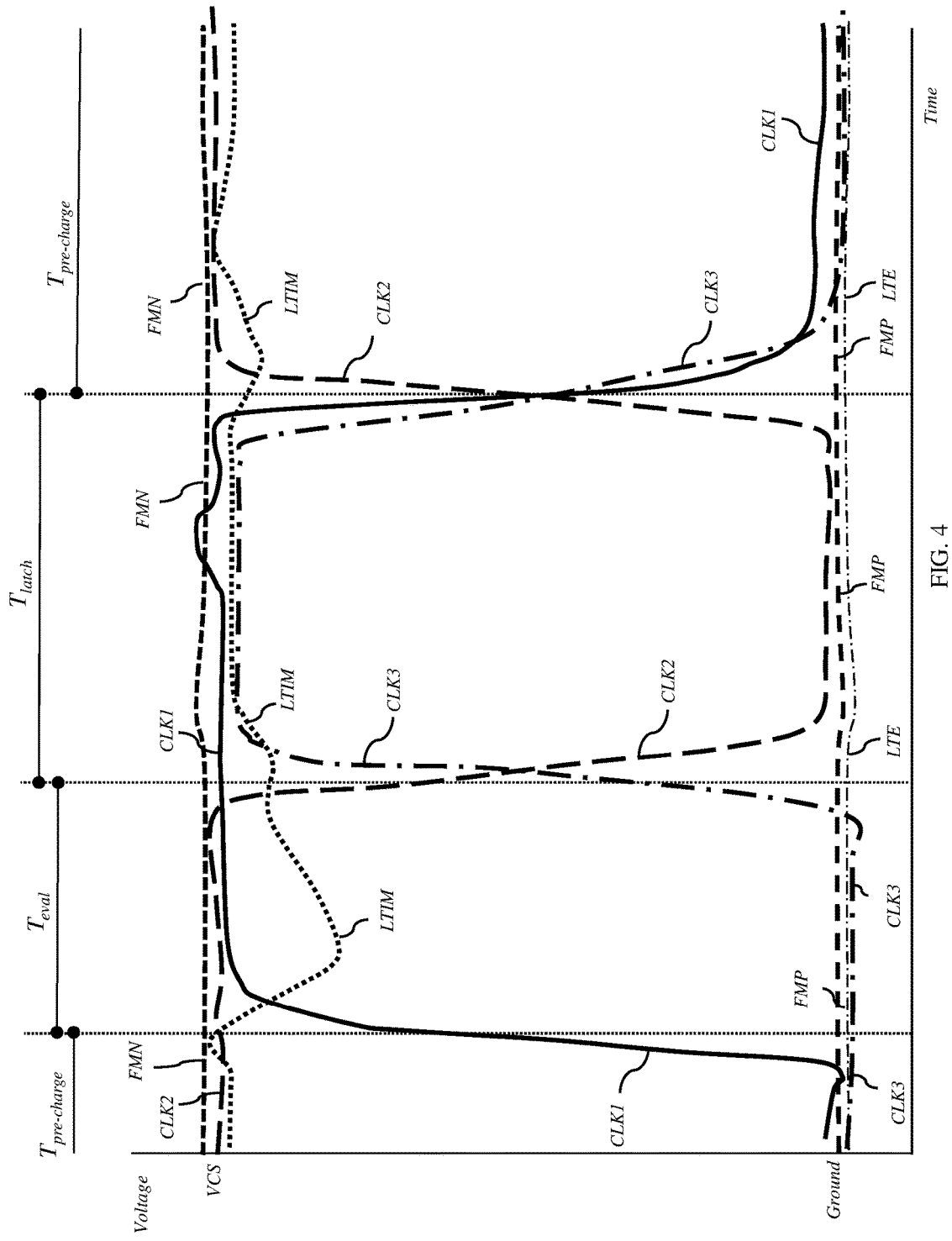
Figure 5:
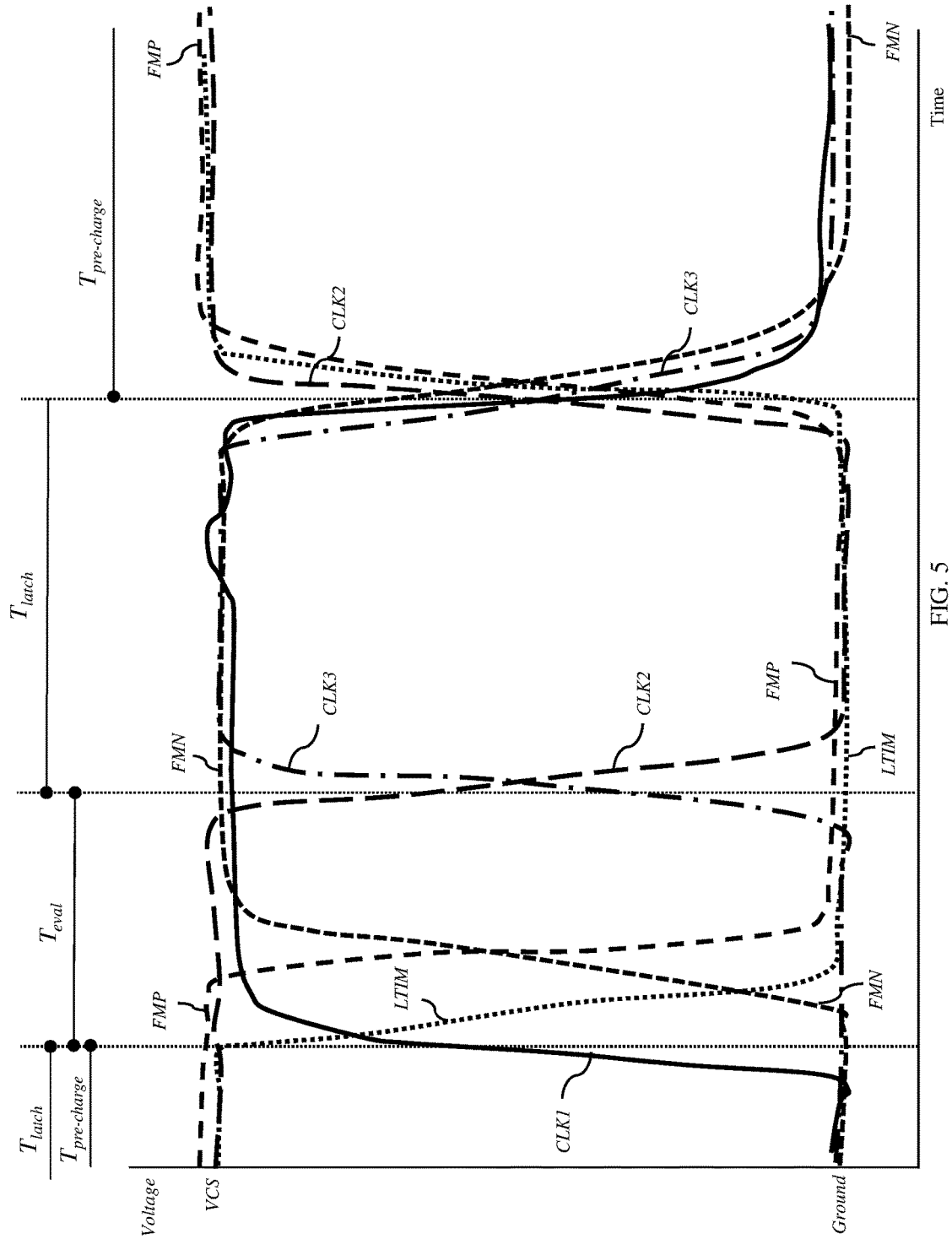

FIGS. 3, 4, and 5 are exemplary timing diagrams each illustrating the first clock signal (CLK1), the second clock signal (CLK2) and the third clock signal (CLK3) and further indicating the changing states of the first final match signal (FMN) and the second final match signal (FMP) as a function of the initial match signal (LTIM) and the enable signal (LT). When considering these timing diagrams it should be understood that in the embodiment of the row address comparator 100A of FIG. 1A, a high voltage initial match signal (LTIM) occurs during the evaluation time period (Teval) when a comparison of the inverted primary row address and the stored row address indicates a complete mismatch (thereby indicating a complete match between the primary row address and the stored row address). In the embodiment of the row address comparator 100B of FIG. 1B, a high voltage initial match signal (LTIM) occurs during the evaluation time period (Teval) when a comparison of the actual primary row address and the stored row address indicates a complete match.

FIG. 3 is an exemplary timing diagram illustrating the first clock signal (CLK1), the second clock signal (CLK2) and the third clock signal (CLK3) and the changing states of the initial match signal (LTIM), the first final match signal (FMN) and the second final match signal (FMP) during the pre-charge, evaluation and latch operations, specifically when the enable signal (LTE) is at a logic 1 and when the primary row address (PR_ADDR [ax:a0]) and the stored row address (SR_ADDR [bx:b0]) are identical. In this case, one of the two final match signals (e.g., FMP) could be employed in a row redundancy control circuit to cause the specific redundant row to be employed as a substitute for the primary row identified by the primary row address.

FIG. 4 is an exemplary timing diagram illustrating the first clock signal (CLK1), the second clock signal (CLK2) and the third clock signal (CLK3) and the changing states of the initial match signal (LTIM), the first final match signal (FMN) and the second final match signal (FMP) during the pre-charge, evaluation and latch operations specifically when the enable signal (LTE) is at a logic 0 and when the primary row address (PR_ADDR [ax:a0]) and the stored row address (SR_ADDR [bx:b0]) are identical. In this case, because the enable signal is a logic 0, the output final match signals would not cause the specific redundant row to be employed as a substitute for the primary row identified by the primary row address even given the match state.

FIG. 5 is an exemplary timing diagram illustrating the first clock signal (CLK1), the second clock signal (CLK2) and the third clock signal (CLK3) and the changing states of the initial match signal (LTIM), the first final match signal (FMN) and the second final match signal (FMP) during the pre-charge, evaluation and latch operations specifically when the enable signal (LTE) is either a logic 1 or a 0 and when the inverted primary row address (PR_ADDRbar [a'x:a'0]) (referred to herein as the first row address) and the stored row address (SR_ADDR [bx:b0]) (referred to herein as the second row address) at least partially match (thereby indicating that the primary row address (PR_ADDR [ax:a0]) and the stored row address (SR_ADDR [bx:b0]) do not match. In this case, the output final match signals would not cause the specific redundant row to be employed as a substitute for the primary row identified by the primary row address due to the non-match state.

It should be noted that the evaluation time period (Teval) for performing the evaluation operation and, more specifically, the comparison of the first row address 111 and the second row address 112 is set by CLK1 and CLK2 and, specifically, by the amount of delay between the first rising edge of CLK1 and the second falling edge of CLK2. This delay should be long enough to register a worst-case match scenario. Specifically, it should be long enough to allow the feed-forward path 120 to be pulled down to the low voltage level if/when only one of the bits for the first row address 111 (i.e., the inverted primary row address) and the second row address 112 (i.e., the stored row address) match such that only of the bit match signals ($d_{0-x}$) is a logic 1 and, thus, such that only one of the parallel-connected pull-down transistors $116_{0-x}$ is turned on.

The amount of delay necessary could be estimated through simulation and a conventional fixed delay clock generator could be employed to generate CLK2 (and CLK3, which as mentioned above is simply an inverted version of CLK2) in the second voltage domain with a fixed amount of delay between the first rising edge of CLK1 and the second falling edge of CLK2. However, estimation of the amount of delay necessary must be very conservative (i.e., must have a significantly large margin of error) to account for variations in operating conditions (e.g., different VDDs, different operating temperatures, etc.).

Figure 6:
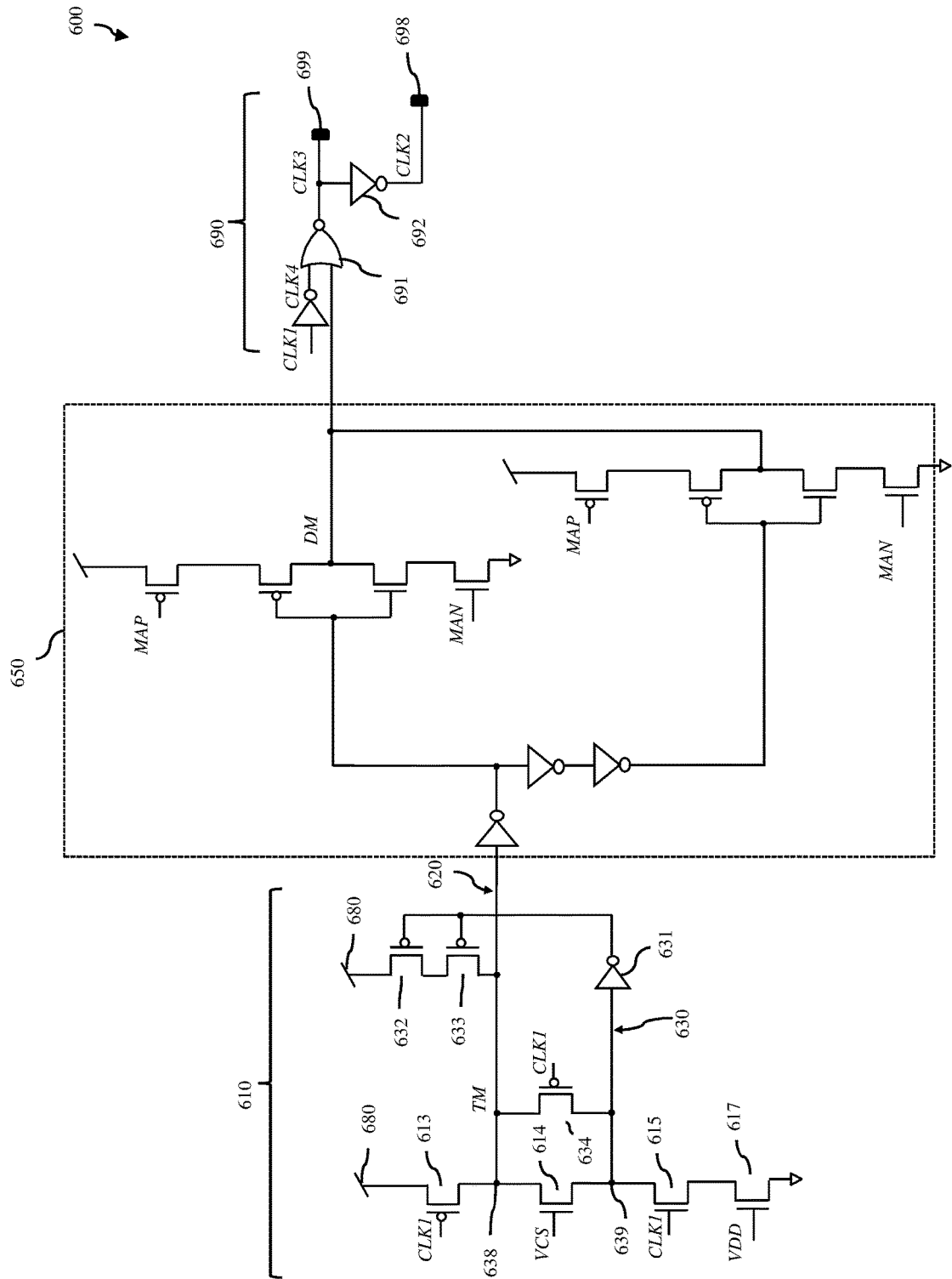
FIG. 6 is a schematic diagram illustrating an exemplary mimic clock generator that can be employed to generate the clock signals used to control the various operations performed by the row address comparator.

Alternatively and preferably, a mimic clock generator, such as the exemplary mimic clock generator 600 shown in FIG. 6, could be employed to generate CLK2 (and CLK3, which as mentioned above is simply an inverted version of CLK2) in the second voltage domain such that the amount of delay between the first rising edge of CLK1 and the second falling edge of CLK2 varies depending upon variations in the operating conditions. Specifically, the mimic clock generator 600 can be adapted to generate an amount of delay that is sufficient to register a voltage drop on the feed-forward path 120 when only one transistor is turned on with an optional margin for error. To accomplish this, the mimic clock generator 600 can include a mimic section 610, an optional margin adjustment section 650, and a clock signal output section 690.

The mimic section 610 can be configured similarly to the evaluation section 110 of the row address comparator 100A of FIG. 1A or 100B of FIG. 1B. Specifically, it can include a pull-up transistor 613 (which is configured the same as the pull-up transistor 113), a first pull-down transistor 614 (which is configured the same as the first pull-down transistor 114), a second pull-down transistor 615 (which is configured the same as the second pull-down transistor 115), and a third pull-down transistor 617 (which is configured the same as a single one of the parallel-connected pull-down transistors 117). These transistors 613-615 and 617 can be connected in series between a positive voltage rail 680 in the second voltage domain (i.e., at VCS) and ground. Thus, instead of multiple parallel-connected pull-down transistors between the second pull-down transistor and ground (as in the evaluation section of the row address comparator), the mimic section 610 of the mimic clock generator 690 includes only a single third pull-down transistor.

The mimic section 610 can further include a feed-forward path 620 (i.e., a wire or other interconnect) that electrically connects a node 638, which is at the junction between the drain regions of the pull-up transistor 613 and the first pull-down transistor 614, to the margin adjustment section 650. The feed-forward path 620 is adapted to output a mimic signal (M) to the latch section 150.

The mimic section 610 can further include a feedback loop 630. The feedback loop 630 can include: a pair of series-connected pull-up transistors 632 and 633 (i.e., series-connected PFETs) connected between the positive voltage rail 680 and the feed-forward path 620; an inverter 631 having an input connected to a node 639 at the junction between the source region of the first pull-down transistor 614 and the drain region of the second pull-down transistor 615 and an output connected to the gates of the series-connected pull-up transistors 632-633; and an additional pull-up transistor 634 (i.e., an additional PFET) having a source region connected to the feed-forward path 620, and a drain region connected to the feedback loop 630 downstream of the inverter 631.

In the mimic section 610, the gates of the pull-up transistor 613, the second pull-down transistor 615, and the additional pull-up transistor 634 are adapted to receive CLK1 (which is in the second voltage domain) such that the on/off states of the pull-up transistor 613, the second pull-down transistor 615, and the additional pull-up transistor 634 are all controlled by CLK1, which as mentioned above is in the second voltage domain. The gate of the first pull-down transistor 614 is adapted to receive the second maximum positive supply voltage employed in the second voltage domain (i.e., VCS), whereas the gate of the third pull-down transistor 617 is adapted to receive the first maximum positive supply voltage employed in the first voltage domain (i.e., VDD). As mentioned above, the gates of the series-connected pull-up transistors 632-633 are adapted to receive the output of the inverter 631 such that the on/off state of these pull-up transistors 632-633 are controlled by the output of the inverter 631 and, thereby the voltage level on the feedback path adjacent to the input of the inverter (e.g., the voltage level at the node 639 between the pull-down transistors 614 and 615). During a pre-charge operation in the mimic section 610 when CLK1 is low, the mimic signal (M) on the feed-forward path 620 will be pulled to the high voltage state in the second voltage domain (i.e., to VCS). However, when CLK1 switches to the high voltage state, the pull-down transistors 614, 615, and 617 will all be on and the mimic signal (M) on the feed-forward path 620 will be pulled down through those transistors to the low voltage state, thereby mimicking what occurs in the evaluation section 110 of the row address comparator when only a single one of the parallel-connected pull-down transistors $117_{0-x}$ turns on during the evaluation operation.

The amount of time it actually takes for the mimic signal (M) to switch to the low voltage state is the absolute minimum amount of delay necessary for setting the second falling edge of CLK2 (and the concurrent third rising edge of CLK3) following the first rising edge of CLK1 in order to ensure that the voltage drop is registered. Thus, in one embodiment (not shown), the clock signal output section 690 could be connected directly to the mimic section 610 and could cause the states of CLK2 and CLK3, which are in the second voltage domain, to switch immediately upon the mimic signal (M) switching to the low voltage state. Alternatively, in another embodiment, in order to avoid fails (e.g., caused by changes in the pull-down time due to variations in voltage (e.g., different VDDs), variations in operation temperature, etc.), the mimic clock generator 600 can also include the optional margin adjustment section 650 in line between the mimic section 610 and the clock signal output section 690. The margin adjustment section 650 can be a delay circuit adapted to receive the mimic signal (M) and to add a predetermined amount of delay to the mimic signal (M) (e.g., based on margin adjustment signals (MAP and MAN)). In this case, the clock signal output section 690 would receive the delayed mimic signal (DM) so that switching of the states of CLK2 and CLK3 in the clock signal output section 690 is similarly delayed.

The clock signal output section 690 can, for example, include a NOR gate 691 adapted to receive, as inputs, an inverted version of CLK1 (referred to herein as CLK4) and, depending upon the embodiment, either the mimic signal (M) directly from the mimic section 610 (not shown) or the delayed mimic signal (DM) from the margin adjustment section 650. The clock signal output section 690 can further include an inverter 692 connected in series with the NOR gate 691, one clock signal output node 699 for outputting CLK3 at the output of the NOR gate 691 (i.e., between the NOR gate 691 and the inverter 692), and an additional clock signal output node 698 for outputting CLK2 at the output of the inverter 692. The NOR gate 691 can be adapted to output CLK3 at the clock signal output node 699 according to a conventional NOR gate truth table and the inverter 692 can be adapted to output an inverted version of CLK3 (i.e., CLK2) at the additional clock signal output node 698. Since, as mentioned above, the mimic signal (M) is only pulled down in the mimic section 610 when CLK1 is high and, thus, when CLK4 is low. Furthermore, since the output of a NOR gate only switches to a logic 1 when both inputs are logic 0's, CLK3 at the clock signal output node 699 will only switch to high and CLK2 at the additional clock signal output node 698 will only switch to low (i.e., the third rising edge of CLK3 and the second falling edge of CLK2 will only occur) when the other input to the NOR gate 691 (i.e., M or DM depending upon the embodiment) switches from high to low. It should be understood that when CLK2 and CLK3 are generated as described above and in the second voltage domain using the mimic clock generator 600, the delay between the first rising edge of CLK1 and the second falling edge of CLK2 (or concurrent third rising edge of CLK3) will be variable, will be sufficiently long to register a drop in voltage on the feed-forward path when only a single NFET is turned on (pulse some optional margin of error) and will account for variations in operating conditions such as voltage variations (e.g., different VDDs) and temperature variations. By employing such a variable delay, hold time can be minimized and yield can be improved.

Figure 7A:
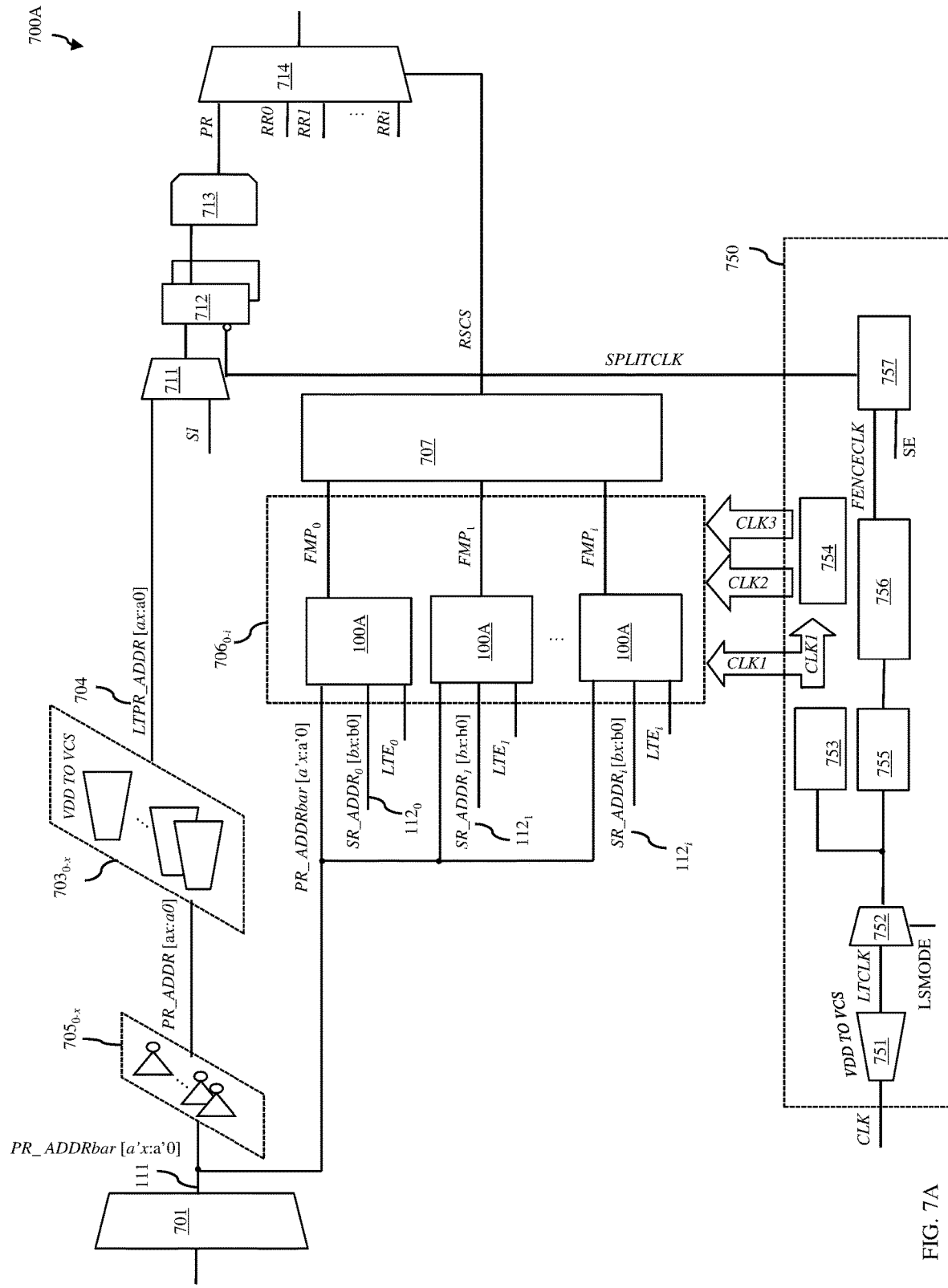
FIG. 7A is a schematic diagram illustrating an embodiment of a row redundancy control circuit that incorporates the row address comparator shown in FIG. 1A.

FIG. 7A is schematic diagram illustrating an exemplary embodiment of a row redundancy control circuit 700A incorporating one or more row address comparator(s) 100A with integrated voltage level shifting (also referred to herein as voltage level translating) and latching functionality (as described above and illustrated in FIG. 1A). Similarly, FIG. 7B is a schematic diagram illustrating an exemplary embodiment of a row redundancy control circuit 700B incorporating row address comparator(s) 100B, respectively, with integrated voltage level shifting and latching functionality (as described above and illustrated in FIG. 1B).

Figure 7B:
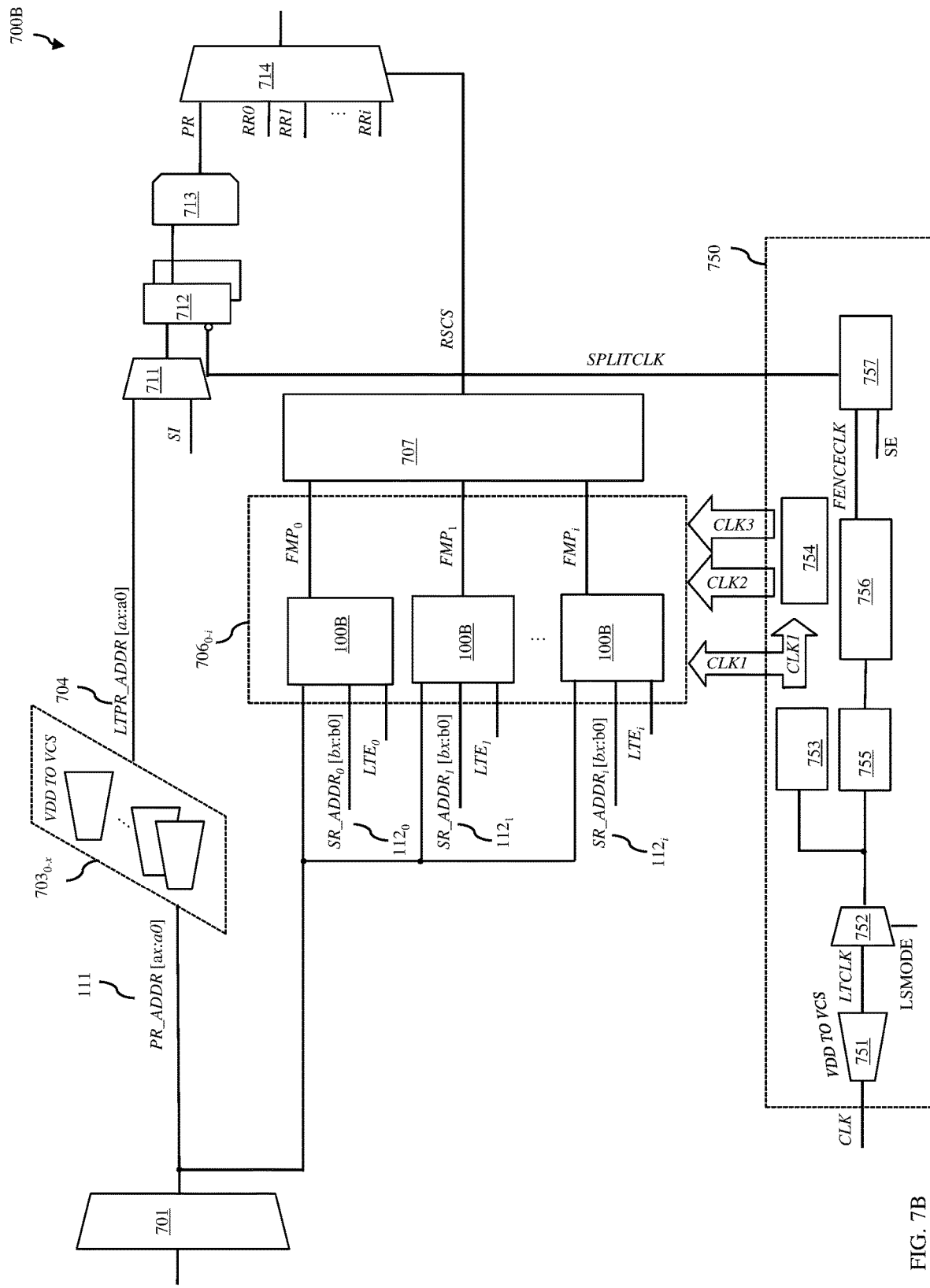
FIG. 7B is a schematic diagram illustrating an embodiment of a row redundancy control circuit that incorporates the row address comparator shown in FIG. 1B.

Referring to FIGS. 7A and 7B, the disclosed row redundancy control circuit embodiments 700A, 700B can receive a first row address 111, which is associated with a primary row in a memory array and which is in a first voltage domain. As mentioned above, the first voltage domain has a first maximum positive supply voltage (i.e., VDD) and the second voltage domain has a second maximum positive supply voltage (i.e., VCS) that is greater than the first maximum positive supply voltage. The first row address 111 can be received, for example, from a multiplexor 701 that selects between an input row address or a test row address.

The row redundancy control circuits embodiments 700A, 700B can also include a first leg for decoding the primary row address and a second leg for row redundancy control. Specifically, in the row redundancy control circuit 700A of FIG. 7A, the received first row address 111 is an inverted primary row address (PR_ADDRbar [a'x:a'0]). That is, it is an inverted version of a primary row address (PR_ADDR [ax:a0]) for a primary row. As mentioned above, in an inverted primary row address, the value of each bit in the primary row address has been switched (i.e., logic 1's are switched to logic 0's and vice versa) by a set of inverters. The first leg of this row redundancy control circuit 700A can include a set of inverters $705_{0-x}$ adapted to invert the inverted primary row address back into a primary row address (PR_ADDR [ax:a0]) for further processing within the first leg, as discussed below. The set of inverters $705_{0-x}$ can include one inverter for each bit in the primary row address. Thus, if the inverted primary row address has x+1 bits, then the set of inverters will include x+1 inverters (i.e., inverters $705_0$ to $705_x$). Each inverter $705_{0-x}$ in the set can be adapted to switch the bit at a given bit position from one logic value to the opposite logic value. Thus, all logic 1's in the inverted primary row address will be switched to logic 0's and vice versa. Contrarily, in the row redundancy control circuit 700B of FIG. 7B, the received first row address 111 is an actual primary row address (PR_ADDR[ax:a0]). Thus, the first leg of this row redundancy control circuit 700B does not require the set of inverters.

The remaining components of the first leg can be essentially the same. Specifically, the first leg of the row redundancy control circuit 700A, 700B can include a set of voltage level translators $703_{0-x}$ (also referred to herein as voltage level shifters) adapted to convert the primary row address (PR_ADDR [ax:a0]) from the first voltage domain to the second voltage domain. The set of voltage level translators can include one voltage level translator for each bit in the primary row address. So if the primary row address has x+1 bits, then the set will include x+1 voltage level translators (i.e., voltage level translators $703_0$ to $703_x$). Each voltage level translator in the set can be adapted to shift a bit at a given bit position in the primary address from the first voltage domain to the second voltage domain. Thus, logic 1's in the primary row address are shifted from VDD up to VCS in order to generate a voltage-level translated primary row address 704 (LTPR_ADDR [ax:a0]). The voltage level-translated primary row address (LTPR_ADDR [ax:a0]) can be further processed in the row redundancy control circuit by peripheral logic including, but not limited to, a multiplexor 711, latches 712, and decoder 713. Specifically, the multiplexor 711 can be controlled by a SPLITCLK (discussed in further detail below) and can select between the level-translated primary row address (LTPR_ADDR [ax:a0]) and a scan in signal (SI). The selected address can be held by the latch 712 for the entire duration of operation defined by the SPLITCLK. The latched address bits can then be decoded hierarchically using two bits at a time at decoder 713 (e.g., the 2 least significant bits (LSBs) of latched and level translated primary row address bit LTPR_ADDR [1:0] can be converted to 4 bits of RDEC_ADDR10 [3:0]. RDEC_ADDR32 [3:0], RDEC_ADDR54 [3:0], RDEC_ADDR76 [3:0] can be generated in similar fashion generating 16 bits of row information from the 8 bit address LTPR_ADDR [7:0]).

The second leg of the row redundancy control circuit 700A, 700B can include one or more row address comparators $706_{0-i}$, configured for processing the received first row address 111 and associated with one or more different redundant rows, respectively, of the memory. Thus, for one redundant row, there would be one comparator; for two redundant rows, there would be two row address comparators; for three redundant rows, there would be three row address comparators; and so on. For purposes of illustration only three row address comparators are shown; however, it should be understood that a memory can include one or more redundant rows and the row redundancy control circuit can include a corresponding number of row address comparators.

In the row redundancy control circuit 700A of FIG. 7A, each row address comparator $706_{0-i}$, can be configured specifically for processing an inverted primary row address. That is, each row address comparator can be configured in the same manner as the row address comparator 100A described in detail above and illustrated in FIG. 1A. In the row redundancy control circuit 700B of FIG. 7B, each row address comparator $706_{0-i}$, can be configured specifically for processing the actual primary row address. That is, each row address comparator can be configured in the same manner as the row address comparator 100B described in detail above and illustrated in FIG. 1B.

In either case, each row address comparator $706_{0-i}$ can be associated with a specific one of the redundant rows. That is, row address comparator $706_0$ can be associated with the specific redundant row 0 ($RR_0$), row address comparator $706_1$ can be associated with the specific redundant row 1 ($RR_1$), . . . and row address comparator $706_i$ can be associated with the specific redundant row i ($RR_i$).

Each row address comparator $706_{0-i}$ in the row redundancy control circuit 700A or 700B can receive the same first row address 111 and a different stored row address (referred to as the second row address), which is also in the first voltage domain and which is received from a location in a defective row memory associated with a specific redundant row. Thus, for example, the row address comparator $706_0$ can be configured to receive the first row address 111 and a second address $112_0$ (e.g., the stored row address ($SR\_ADDR_0[bx:b0]$) accessed from a location associated with $RR_0$; the row address comparator $706_1$ can be configured to receive the first row address and a second address $112_1$ (e.g., stored row address ($SR\_ADDR_1[bx:b0]$) accessed from a location associated with $RR_1$; and the row address comparator $706_i$ can be configured to receive the first row address 111 and a second address $112_i$ (e.g., stored row address ($SR\_ADDR_i[bx:b0]$) accessed from a location associated with $RR_i$.

Each row address comparator $706_{0-i}$ can further be adapted to receive a corresponding row redundancy enable signal for the specific redundant row. That is, row address comparator $706_0$ will receive an enable signal ($LTE_0$) for $RR_0$, row address comparator $706_1$ will receive an enable signal ($LTE_1$) for $RR_1$, . . . and row address comparator $706_i$ will receive an enable signal ($LTE_i$) for $RR_i$. It should be noted that row redundancy enable signals are typically received by the row redundancy control circuit in the first voltage domain and must be voltage level translated for further processing in the row address comparator. Thus, the row redundancy control circuit 700A, 700B may include additional voltage level translators for shifting the voltage levels of these enable signals prior to forwarding them to the row address comparators, respectively. Optionally, the row redundancy control circuit 700A, 700B may further include gates between the voltage level shifters for the row redundancy enable signals and the corresponding row address comparators. Incorporating voltage level shifters and gates into row redundancy control circuits for processing row redundancy enable signals prior to receipt by row address comparators is known in the art. To avoid clutter and to allow the reader to focus on the salient aspects of the disclosed row redundancy control circuit 700A, 700B, these features have been omitted from the diagrams and the details thereof are not included herein.

In any case, each row address comparator $706_{0-i}$ can be adapted to receive the first row address 111 and a redundant row-specific stored row address (i.e., a second row address 112) in the first voltage domain and to perform pre-charge, evaluation and latching operations in order to output and latch a corresponding final match signal ($FMP_{0-i}$) that is in the second voltage domain.

The pre-charge and evaluation operations can be performed in an evaluation section adapted to pre-charge a feed-forward path to VCS, to compare the two received row addresses in the first voltage domain and, based on the results of the comparison, to either maintain the voltage level on the feed-forward path at VCS or to pull it down to ground, thereby outputting an initial match signal (LTIM) on the feed-forward path. Since the initial match signal (LTIM) is at VCS or ground it is considered voltage-level translated into the second voltage domain. The pre-charge and evaluation operations can be controlled by two different clock signals that are in the first voltage domain (i.e., CLK1 and CLK2, which is different from CLK1). As discussed in detail above, the evaluation time period (Teval) for performing the evaluation operation and, more specifically, the comparison of the two row addresses is set by CLK1 and CLK2 and, specifically, by the amount of delay between the first rising edge of CLK1 and the second falling edge of CLK2. This delay is set so that it is long enough to register a change in state of the initial match signal.

The latch operation can be performed in a latch section, which receives the initial match signal (LTIM) from the evaluation section and the corresponding row redundancy enable signal ($LTE_{0-i}$) and which outputs and latches a corresponding final match signal ($FMP_{0-i}$) based on the logic values the received initial match and enable signals. The final match signals are in the second voltage domain. The latch operation can be controlled by two different clock signals that are also in the second voltage domain including CLK2 and CLK3, which is inverted with respect to CLK2.

As mentioned above, the final match signals ($FMP_{0-i}$) output from the latch sections of the row address comparators will all be generated in the second voltage domain and latched. A final match signal ($FMP_{0-i}$) with a logic value of 1 can indicate that the specific redundant row ($RR_{0-i}$) associated with the specific row address comparator $706_{0-i}$ should be used as a substitute for the primary row identified by the primary row address because: (a) the primary row address and the stored row address match; and (b) the enable signal ($LTE_{0-i}$) for that specific redundant row ($RR_{0-i}$) is a logic 1. Contrarily, a final match signal ($FMP_{0-i}$) with a logic value of 0 can indicate that the specific redundant row ($RR_{0-i}$) associated with the specific row address comparator $706_{0-i}$ should not be used as a substitute for the primary row identified by the primary row address because: (a) the primary row address and the stored row address do not match and/or (b) the enable signal ($LTE_{0-i}$) is at a logic 0. It should be understood that, if the primary row has not been found to be defective, then none of the stored row addresses associated with the redundant rows should match the primary row address. Furthermore, since typically only one redundant row will ever be authorized for use as a substitute for a given primary row that has been found to be defective, a maximum of only one stored row address should ever match the primary row address. Thus, the final match signals ($FMP_{0-i}$) should either be all logic 0's or there will be a single final match signal output by a single one of the row address comparators that is a logic 1.

The row redundancy control circuit 700A, 700B can further include a match controller 707 and a row select multiplexor 714. The match controller 707 can be adapted to receive the multiple final match signals ($FMP_{0-i}$) from the multiple row address comparators $706_{0-i}$, respectively. Based on the logic values of these final match signals ($FMP_{0-i}$), the match controller 707 can output a row selection control signal (RSCS) to the row select multiplexor 714. The row selection control signal (RSCS) can specifically indicate which row should be selected for wordline activation in order to accomplish an upcoming read/write operation. The row select multiplexor 714 can be adapted to receive the row selection control signal (RSCS) and multiple row decode signals from the decoder 713 (including discrete row decode signals for activating the wordline of the primary row identified by the primary row address and for activating each of the redundant rows) and to select and output the specific row decode signal for activating the specific wordline of the primary row or one of the redundant rows based on the row selection control signal (RSCS).

The row redundancy control circuit 700A, 700B can further include a clock signal generation circuit 750 for generating the multiple different clock signals including, but not limited to, CLK1, CLK2, and CLK3 (as discussed in detail above, illustrated in FIG. 2 and employed to control the row address comparators), a fence clock signal (FENCE-CLK), and a split clock signal (SPLTCLK). Specifically, the clock signal generation circuit 750 can receive an initial clock signal (CLK) in the first voltage domain and can include a voltage level shifter 751 adapted to shift CLK to the second voltage domain (i.e., to output a voltage-level translated clock signal (LTCLK)). The clock signal generation circuit 750 can further include a multiplexor 752 for outputting LTCLK depending upon the operating mode. The clock signal generation circuit 750 can further include a first clock generator 753 adapted to receive LTCLK, to generate CLK1 based on LTCLK, and to output CLK1 to each of the row address comparators $706_{0-i}$, and to a second clock generator 754. The second clock generator 754 can be adapted to generate CLK2 and CLK3 based on CLK1 and to output CLK2 and CLK3 to each of the row address comparators $706_{0-i}$. The second clock generator 754 can be a mimic clock generator, such as the mimic clock generator 600 of FIG. 6. Alternatively, the second clock generator 754 could be a fixed delay clock generator. Additional components of the clock signal generation circuit 750 can include VDD track 755, a third clock generator 756 (i.e., a fenced clock generator, which generates (FENCECLK) and a clock splitter 757 (which generates SPLTCLK). Such clock components are well-known in the art and, thus, the details thereof have been omitted from this specification in order to allow the reader to focus on the salient aspects of the disclosed embodiments. However, it should be noted that in a fenced architecture, all the signals are gated with FENCE-CLK to restrict the data setup time and hold time at the initial stages in control, hence the term "fencing".

It should be noted that, since each row address comparator $706_{0-i}$ in the above-described row redundancy control circuit 700A, 700B can perform an evaluation operation with respect to two row addresses in the first voltage domain and can output a corresponding final match signal ($FMP_{0-i}$) in the second voltage domain, significantly fewer voltage level shifters are required to operate. Additionally, since the row address comparators $706_{0-i}$ (either row address comparators 100A in the control circuit 700A or row address comparators 100B in the control circuit 700B) also latch the final match signals ($FMP_{0-i}$), respectively, latches are not required downstream of the row address comparators (e.g., between the match controller 707 and the row select multiplexor 714). As a result, the disclosed row redundancy control circuit 700A, 700B consumes less chip area and reduces circuit complexity and improves performed (e.g., reduces delay) as compared to prior art row redundancy control circuits used to implement row redundancy schemes.

Figure 8:
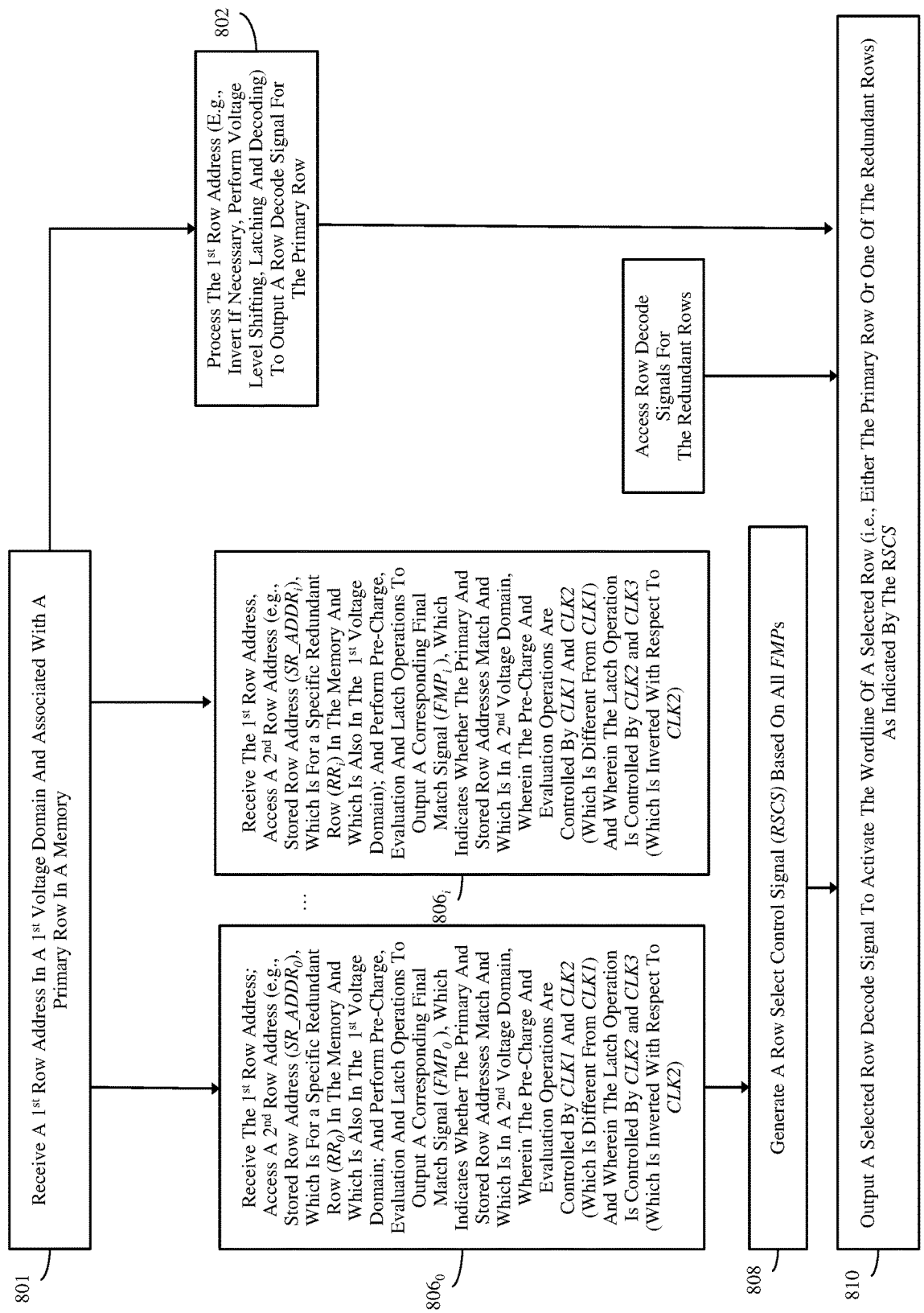
FIG. 8 is a flow diagram illustrating an embodiment of a row redundancy control method.

FIG. 8 is a flow diagram illustrating disclosed embodiments of a method for implementing a row redundancy scheme that includes integrating row address comparison, voltage level shifting and latching operations.

Referring to FIG. 8 in combination with the discussion above of the row address comparators 100A and 100B of FIGS. 1A and 1B and the row redundancy control circuits 700A and 700B of FIGS. 7A and 7B, respectively, the method can include receiving (e.g., by a row redundancy control circuit from built-in self-test multiplexor) a first row address 111 that identifies a primary row in a memory array (see process step 801). Depending upon the embodiment, this first row address 111 could be an inverted primary row address (PR_ADDRbar [a'x:a'0]) (i.e., an inverted version of the primary row address for the primary row) or, alternatively, the actual primary row address (PR_ADDR [ax:a0]) for the primary row. In any case, the first row address can be in a first voltage domain and can be a selected one of either an input row address or a test row address, depending upon the operating mode. As mentioned above, the first voltage domain has a first maximum positive supply voltage (i.e., VDD) and the second voltage domain has a second maximum positive supply voltage (i.e., VCS) that is greater than the first maximum positive supply voltage.

The method can include processing the first row address to enable subsequent activation of a wordline for the primary row (if substitution by a specific redundant row is not determined to be required, as discussed in greater detail below) (see process step 802). Processing of the first row address can include inverting the first row address, if necessary. Specifically, if the received first row address is an inverted primary row address it can be inverted back to the primary row address (PR_ADDR [ax:a0]). Additional processing at process step 802 can include, but is not limited to voltage level shifting of the primary row address (PR_ADDR [ax:a0), latching and decoding.

The method can further include performance of process steps $806_{0-i}$ by one or more row address comparators $706_{0-i}$ that are associated with one or more different redundant rows, respectively, of the memory. As mentioned above, each row address comparator incorporated into the row redundancy control circuit 700A can be configured essentially the same as the row address comparator 100A (and similarly each row address comparator incorporated into the row redundancy control circuit 700B can be configured essentially the same as the row address comparator 100B). The process step $806_{0-i}$ performed by each row address comparator $706_{0-i}$ can include receiving the first row address, which is associated with a primary row in the memory, and further receiving a specific second row address (also referred to herein as a stored row address), which is also in the first voltage domain and which is accessed from a location in a defective row memory associated with a specific redundant row. Thus, for example, at process step $806_0$ one row address comparator $706_0$ can receive the first row address and the stored row address ($SR\_ADDR_0[bx:b0]$) accessed from a location associated with $RR_0$; at process step $806_1$ another row address comparator $706_1$ can receive the first row address and the stored row address ($SR\_ADDR_1[bx:b0]$) accessed from a location associated with $RR_1$; and at process step $806_i$ yet another row address comparator $706_i$ can receive the first row address and the stored row address ($SR\_ADDR_i[bx:b0]$) accessed from a location associated with $RR_i$.

The process step $806_{0-i}$ performed by each row address comparator $706_{0-i}$ can further include receiving a corresponding row redundancy enable signal for the specific redundant row. That is, at process step $806_0$ row address comparator $706_0$ can receive an enable signal ($LTE_0$) for $RR_0$, at process step $806_1$ row address comparator $706_1$ can receive an enable signal ($LTE_1$) for $RR_1$, . . . and at process step $806_i$ row address comparator $706_i$ can receive an enable signal ($LTE_i$) for $RR_i$. It should be noted that row redundancy enable signals are typically received by the row redundancy control circuit in the first voltage domain and must be voltage level translated into the second voltage domain for use by the row address comparators.

The process step $806_{0-i}$ performed by each row address comparator $706_{0-i}$ can further include performing pre-charge, evaluation and latching operations in order to output and latch a corresponding final match signal ($FMP_{0-i}$) in the second voltage domain.

The pre-charge and evaluation operations can be performed in an evaluation section in the row address comparator and can include pre-charging a feed-forward path to VCS, comparing the two received row addresses in the first voltage domain and, based on the results of the comparison, either maintaining the voltage level on the feed-forward path at VCS or pulling it down to ground, thereby outputting an initial match signal (LTIM) on the feed-forward path. As discussed in detail above with regard to the row address comparators 100A, 100B, an initial match signal (LTIM) with a high voltage state (i.e., a logic "1") indicates a match between the primary row address and the stored row address. Since the initial match signal (LTIM) is at VCS or ground, it is considered voltage-level translated into the second voltage domain. The pre-charge and evaluation operations can be controlled by two different clock signals in the second voltage domain including: CLK1 and CLK2, which is different from CLK1. As discussed in detail above, the evaluation time period (Teval) for performing the evaluation operation and, more specifically, the comparison of the two row addresses is set by CLK1 and CLK2 and, specifically, by the amount of delay between the first rising edge of CLK1 and the second falling edge of CLK2. This delay is set so that it is long enough to register a change in state of the initial match signal (LTIM) from VCS to ground on the feed-forward path. In one embodiment of the method, CLK2 can be generated so that Teval is fixed. In another embodiment of the method, CLK2 can be generated (e.g., by a mimic clock generator) so that Teval is sufficiently long to register a change in state of the initial match signal under worst case match conditions and so that Teval is variable depending upon the operating conditions including different operating voltages (e.g., different VDDs) and different operating temperatures.

The latch operation can be performed in a latch section of the row address comparator and can include receiving the initial match signal (LTIM) on the feed-forward path from the evaluation section, receiving the corresponding row redundancy enable signal ($LTE_{0-i}$) and, based on the logic values of the received initial match and enable signals, outputting and latching a corresponding final match signal ($FMP_{0-i}$) that is in the second voltage domain. This latch operation can be controlled by two different clocks signals in the second voltage domain: including CLK2 (discussed above) and CLK3, which is inverted with respect to CLK2. The final match signals ($FMP_{0-i}$) will all be generated in the second voltage domain and latched. A final match signal ($FMP_{0-i}$) with a logic value of 1 can indicate that the specific redundant row ($RR_{0-i}$) associated with the specific row address comparator $706_{0-i}$ should be used as a substitute for the primary row identified by the primary row address because: (a) the primary row address and the stored row address match; and (b) the enable signal ($LTE_{0-i}$) for that specific redundant row ($RR_{0-i}$) is a logic 1. Contrarily, a final match signal ($FMP_{0-i}$) with a logic value of 0 can indicate that the specific redundant row ($RR_{0-i}$) associated with the specific row address comparator $706_{0-i}$ should not be used as a substitute for the primary row identified by the primary row address because: (a) the primary row address and the stored row address do not match and/or (b) the enable signal ($LTE_{0-i}$) is at a logic 0. It should be understood that, if the primary row has not been found to be defective, then none of the stored row addresses associated with the redundant rows should match the primary row address. Furthermore, since typically only one redundant row will ever be authorized for use as a substitute for a given primary row that has been found to be defective, a maximum of only one stored row address should ever match the primary row address. Thus, the final match signals ($FMP_{0-i}$) should either be all logic 0's or there will be a single final match signal output by a single one of the row address comparators that is a logic 1.

The method can further include receiving the final match signals ($FMP_{0-i}$) that are output by the row address comparators $706_{0-i}$, respectively, and based on the logic values of the final match signals ($FMP_{0-i}$), outputting a row selection control signal (RSCS) (see process step 808). The row selection control signal (RSCS) can specifically indicate which row (i.e., the primary row identified by the primary row address or one of the redundant rows) should be selected for wordline activation in order to accomplish an upcoming read/write operation. This process step 808 can be performed by a match controller 707 of the row redundancy control circuit.

The method can further include receiving the row selection control signal (RSCS) and row decode signals from the decoder 713 (including discrete row decode signals for activating the wordline of the primary row identified by the primary row address and for activating each of the redundant rows) and, based on the row selection control signal (RSCS), selecting and outputting one specific row decode signal for activating the wordline of the primary row or the wordline of one of the redundant rows (see process step 810). The process step 810 can be performed by a row select multiplexor 714 of the row redundancy control circuit.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A row address comparator comprising:
an evaluation section adapted to perform an evaluation operation comprising: comparing a first row address and a second row address in a first voltage domain; and, based on results of the comparing, outputting an initial match signal in a second voltage domain different from the first voltage domain, wherein the evaluation operation is controlled using a first clock signal and a second clock signal different from the first clock signal and wherein the first clock signal and the second clock signal are in the second voltage domain; and
a latch section connected to the evaluation section and adapted to perform a latch operation comprising: generating a final match signal based on the initial match signal; and latching the final match signal, wherein the latch operation is controlled using the second clock signal and a third clock signal that is inverted with respect to the second clock signal.

2. The row address comparator of claim 1,
wherein the first row address is associated with a primary row of a memory array, and
wherein the second row address comprises a stored row address received from a defective row memory that is associated with a specific redundant row for the memory array.

3. The row address comparator of claim 2,
wherein the first clock signal has a first rising edge and a first falling edge,
wherein the second clock signal has a second rising edge and a second falling edge,
wherein the second falling edge of the second clock signal occurs between the first rising edge and the first falling edge of the first clock signal and the second rising edge of the second clock signal occurs approximately coincidentally with the first falling edge of the first clock signal,
wherein pre-charging is triggered in the evaluation section when the first clock signal switches to a low voltage state,
wherein the comparing is triggered following the pre-charging when the first clock signal switches to a high voltage state while the second clock signal is in the high voltage state and is completed when the second clock signal switches to a low voltage state, and
wherein the latching is triggered when the second clock signal switches to the low voltage state and the third clock signal concurrently switches to the high voltage state.

4. The row address comparator of claim 3,
wherein the evaluation section comprises:
a set of logic gates, wherein each logic gate is adapted to receive one first bit of the first row address and a corresponding second bit of the second row address and to output a bit match signal in the first voltage domain;
a positive voltage rail in the second voltage domain;
a ground rail;
a pull-up transistor, a first pull-down transistor, a second pull-down transistor and a set of parallel-connected pull-down transistors connected in series between the positive voltage rail and the ground rail; and
a feed-forward path electrically connecting a first junction between the pull-up transistor and the first pull-down transistor to the latch section,
wherein the feed-forward path is adapted to output the initial match signal to the latch section,
wherein the parallel-connected pull-down transistors are controlled by bit match signal outputs of the logic gates, respectively,
wherein the pull-up transistor and second pull-down transistor are controlled by the first clock signal,
wherein the first pull-down transistor is controlled by the second clock signal,
wherein, during the pre-charging, the feed-forward path is pre-charged to the high voltage state,
wherein, during the evaluation operation, when a primary row address for the primary row and the second row address match, the initial match signal on the feed-forward path remains in the high voltage state and,
wherein, during the evaluation operation, when the primary row address and the second row address are different, the initial match signal on the feed-forward path switches to the low voltage state.

5. The row address comparator of claim 4, wherein a time period for the comparing is defined by a delay between the first rising edge of the first clock signal and the second falling edge of the second clock signal and wherein the second clock signal is received from a mimic clock generator that generates the second clock signal so that the delay is sufficient to register a voltage drop on the feed-forward path when only one of the parallel-connected pull-down transistors is turned on.

6. The row address comparator of claim 4, wherein the evaluation section further comprises:
a first feedback loop comprising:
a pair of series-connected pull-up transistors connected between the positive voltage rail and the feed-forward path;
an inverter having an input connected to a second junction between the first pull-down transistor and the second pull-down transistor and an output connected to gates of the series-connected pull-up transistors; and
an additional pull-up transistor controlled by the first clock signal and connected between the feed-forward path and the first feedback loop adjacent to the first junction and the second junction, respectively.

7. The row address comparator of claim 6, wherein the first feedback loop prevents unwanted switching of the initial match signal from the high voltage state to the low voltage state due to parasitic capacitance when the primary row address and the second row address match and further ensures that the initial match signal switches from the high voltage state to the low voltage state when the primary row address and the second row address are different.

8. The row address comparator of claim 4, wherein the latch section comprises:
a NAND gate that receives the initial match signal from the feed-forward path of the evaluation section and an enable signal and to output a first final match signal at a first output node; and an inverter connected to the first output node, wherein the inverter inverts the first final match signal and outputs, at a second output node, a second final match signal inverted with respect to the first final match signal, wherein the first final match signal will have the low voltage state only when the initial match signal and the enable signal have high voltage states indicating that the primary row address and the stored row address are identical and that row redundancy is enabled, respectively;

two series-connected pull-up transistors connected between the positive voltage rail and the feed-forward path adjacent to the NAND gate; and two series-connected pull-down transistors connected between the ground rail and the feed-forward path adjacent to the NAND gate, wherein the two series-connected pull-up transistors are controlled by the first final match signal in a second feedback loop and the second clock signal, respectively, and the two series-connected pull-down transistors are controlled by the first final match signal in the second feedback loop and the third clock signal, respectively, such that a voltage state of the first final match signal is latched following the evaluation operation when the second clock signal switches to the low voltage state and the third clock signal switches to the high voltage state.

9. A row redundancy control circuit comprising:

row address comparators associated with different redundant rows, respectively, of multiple redundant rows of a memory array, wherein each row address comparator comprises:
    an evaluation section that performs an evaluation operation comprising: comparing a first row address and a second row address in a first voltage domain; and, based on results of the comparing, outputting an initial match signal in a second voltage domain that is different from the first voltage domain, wherein the evaluation operation is controlled using a first clock signal and a second clock signal that is different from the first clock signal and wherein the first clock signal and the second clock signal are in the second voltage domain; and
    a latch section connected to the evaluation section that performs a latch operation comprising: generating a final match signal based on the initial match signal; and latching the final match signal, wherein the latch operation is controlled using the second clock signal and a third clock signal that is inverted with respect to the second clock signal;

a match controller receives multiple final match signals from the row address comparators, respectively, and, based on the multiple final match signals, outputs a row selection control signal; and a multiplexor, wherein the multiplexor receives the row selection control signal and selects one row in the memory from amongst a primary row and the multiple redundant rows.

10. The row redundancy control circuit of claim 9, wherein each of the row address comparators the first row address is associated with a primary row of the memory array and the second row address comprises a stored row address received from a defective row memory and associated with a specific redundant row of the multiple redundant rows.

11. The row redundancy control circuit of claim 10, wherein the first clock signal has a first rising edge and a first falling edge, wherein the second clock signal has a second rising edge and a second falling edge, wherein the second falling edge of the second clock signal occurs between the first rising edge and the first falling edge of the first clock signal and the second rising edge of the second clock signal occurs approximately coincidentally with the first falling edge of the first clock signal, wherein pre-charging is triggered in the evaluation section of each row address comparator when the first clock signal switches to a low voltage state, wherein the comparing is triggered in the evaluation section of each row address comparator following the pre-charging when the first clock signal switches to a high voltage state while the second clock signal is in the high voltage state and is completed when the second clock signal switches to a low voltage state, and wherein the latching is triggered in the latch section of each row address comparator when the second clock signal switches to the low voltage state and the third clock signal concurrently switches to the high voltage state.

12. The row redundancy control circuit of claim 11, wherein the evaluation section of each row address comparator comprises:
    a set of logic gates, wherein each logic gate receives one first bit of the first row address and a corresponding second bit of the second row address and outputs a bit match signal in the first voltage domain;
    a positive voltage rail in the second voltage domain;
    a ground rail;
    a pull-up transistor, a first pull-down transistor, a second pull-down transistor and a set of parallel-connected pull-down transistors connected in series between the positive voltage rail and the ground rail; and
    a feed-forward path electrically connecting a first junction between the pull-up transistor and the first pull-down transistor to the latch section,
    wherein the feed-forward path outputs the initial match signal to the latch section,
    wherein the parallel-connected pull-down transistors are controlled by bit match signal outputs of the logic gates, respectively,
    wherein the pull-up transistor and second pull-down transistor are controlled by the first clock signal,
    wherein the first pull-down transistor is controlled by the second clock signal,
    wherein, during the pre-charging, the feed-forward path is pre-charged to the high voltage state,
    wherein, during the evaluation operation, when a primary row address for the primary row and the second row address match, the initial match signal on the feed-forward path remains in the high voltage state and,
    wherein, during the evaluation operation, when the primary row address and the second row are different, the initial match signal on the feed-forward path switches to the low voltage state.

13. The row redundancy control circuit of claim 12, further comprising a mimic clock generator, wherein a time period for the comparing is defined by a delay between the first rising edge of the first clock signal and the second falling edge of the second clock signal and wherein the mimic clock generator generates the second clock signal so that the delay is sufficient to register a voltage drop on the feed-forward path when only one of the parallel-connected pull-down transistors is turned on.

14. The row redundancy control circuit of claim 12, wherein the evaluation section of each row address comparator further comprises a feedback loop that prevents unwanted switching of the initial match signal from the high voltage state to the low voltage state due to parasitic capacitance when the primary row address and the second row address match and further ensures that the initial match signal switches from the high voltage state to the low voltage state when the primary row address and the second row address are different.

15. A method comprising:
performing, by an evaluation section of a row address comparator, an evaluation operation comprising: comparing a first row address and a second row address in a first voltage domain; and, based on results of the comparing, outputting an initial match signal in a second voltage domain different from the first voltage domain, wherein the evaluation operation is controlled using a first clock signal and a second clock signal different from the first clock signal and wherein the first clock signal and the second clock signal are in the second voltage domain; and
performing, by a latch section of the row address comparator, a latch operation comprising: generating a final match signal based on the initial match signal; and latching the final match signal, wherein the latch operation is controlled using the second clock signal and a third clock signal inverted with respect to the second clock signal.

16. The method of claim 15, further comprising:
wherein the first row address is associated with a primary row in a memory array, and
wherein the second row address comprises a stored row address in a defective row memory and associated with a specific redundant row for the memory array.

17. The method of claim 16,
wherein the first clock signal has a first rising edge and a first falling edge,
wherein the second clock signal has a second rising edge and a second falling edge,
wherein the second falling edge of the second clock signal occurs between the first rising edge and the first falling edge of the first clock signal and the second rising edge of the second clock signal occurs approximately coincidentally with the first falling edge of the first clock signal,
wherein the method further comprises performing a pre-charging operation triggered in the evaluation section when the first clock signal switches to a low voltage state,
wherein the comparing is triggered following the pre-charging operation when the first clock signal switches to a high voltage state while the second clock signal is in the high voltage state and is completed when the second clock signal switches to a low voltage state, and
wherein the latching is triggered following the comparing when the second clock signal switches to the low voltage state and the third clock signal concurrently switches to the high voltage state.

18. The method of claim 17,
wherein the performing of the pre-charging operation comprises pre-charging a feed-forward path to a high voltage state prior to the evaluation operation,
wherein the initial match signal is output on the feed-forward path,
wherein, during the evaluation operation, the initial match signal retains the high voltage state when a primary row address for the primary row and the second row address match, and
wherein, during the evaluation operation, the initial match signal switches to a low voltage state when the primary row address and the second row address are different.

19. The method of claim 18,
wherein the performing of the evaluation operation comprises employing a feedback loop to prevent unwanted switching of the initial match signal from the high voltage state to the low voltage state due to parasitic capacitance when the primary row address and the second row address match and ensures that the initial match signal switches from the high voltage state to the low voltage state when the primary row address and the second row address are different.

20. The method of claim 17,
wherein a time period for the comparing is defined by a delay between the first rising edge of the first clock signal and the second falling edge of the second clock signal, and
wherein the method further comprises generating the second clock signal using a mimic clock generator so that the delay is sufficient to register a voltage drop on a feed-forward path when bits of the first row address and second row address differ at all but one bit position.

* * * * *